(12) United States Patent
Kuznetsov

(10) Patent No.: US 7,191,386 B2
(45) Date of Patent: Mar. 13, 2007

(54) METHOD AND APPARATUS FOR ADDITIVE TRELLIS ENCODING

(75) Inventor: Alexander V. Kuznetsov, Pittsburgh, PA (US)

(73) Assignee: Seagate Technology LLC, Scotts Valley, CA (US)

( * ) Notice: Subject to any disclaimer, the term of this patent is extended or adjusted under 35 U.S.C. 154(b) by 452 days.

(21) Appl. No.: 10/879,395

(22) Filed: Jun. 29, 2004

(65) Prior Publication Data

US 2005/0289443 A1    Dec. 29, 2005

(51) Int. Cl.
*H03M 13/03*    (2006.01)
*G11C 29/00*    (2006.01)

(52) U.S. Cl. ....................................... 714/792
(58) Field of Classification Search ................ 714/792; H03M 13/25
See application file for complete search history.

(56) References Cited

U.S. PATENT DOCUMENTS

| | | | |
|---|---|---|---|
| 4,888,779 A | 12/1989 | Karabed et al. ............... 371/43 |
| 5,548,600 A | 8/1996 | Fredrickson et al. .......... 371/43 |
| 5,781,569 A | 7/1998 | Fossorier et al. .......... 371/43.7 |
| 5,809,080 A | 9/1998 | Karabed et al. ............. 375/263 |
| 5,815,515 A | 9/1998 | Dabiri ........................ 371/43.7 |
| 5,996,112 A | 11/1999 | Dabiri et al. ................ 714/795 |
| 6,233,289 B1 | 5/2001 | Fredrickson ................ 375/341 |
| 6,388,587 B1 | 5/2002 | Brickner et al. .............. 341/59 |
| 6,396,254 B1 | 5/2002 | Feyh et al. ............... 324/76.19 |
| 6,400,288 B1 | 6/2002 | Fredrickson et al. .......... 341/59 |
| 6,452,984 B1 | 9/2002 | Banister et al. ............. 375/341 |
| 6,516,443 B1 | 2/2003 | Zook .......................... 714/792 |
| 6,532,253 B1* | 3/2003 | Chen .......................... 375/146 |
| 6,553,541 B1 | 4/2003 | Nikolic et al. .............. 714/795 |
| 6,578,173 B2* | 6/2003 | Alamouti .................... 714/792 |
| 7,013,421 B2* | 3/2006 | Betts .......................... 714/792 |
| 2002/0188906 A1 | 12/2002 | Kurtas et al. ............... 714/755 |
| 2004/0064779 A1 | 4/2004 | Vasic et al. ................. 714/758 |
| 2005/0074068 A1* | 4/2005 | Borran et al. ............... 375/264 |

OTHER PUBLICATIONS

Ran et al.; On Cyclic Reversible Self-Dual Additive Codes with Odd Length Over Z; IEEE Transactions on Information Theory, vol. 46, No. 3, May 2000; pp. 1056-1059.*

Phelps et al.; On Binary -Perfect Additive Codes: Some Structural Properties; IEEE Transactions on Information Theory, vol. 48, No. 9, Sep. 2002; pp. 2587-2592.*

* cited by examiner

*Primary Examiner*—R. Stephen Dildine
(74) *Attorney, Agent, or Firm*—Westman, Champlin & Kelly P.A.

(57) ABSTRACT

A method of additive encoding of data words includes receiving a plurality of data words, and searching a trellis representation of additive code words to identify a path in the trellis representing a sequence of patterns to be used to encode the data words. The trellis representation is of all possible combinations of matching patterns in a sequence of additive code words. The trellis representation of the additive code words is searched to identify a sequence of flags representing the sequence of patterns to be used to encode the data words.

25 Claims, 18 Drawing Sheets

Encoding equation: $v(i) = u(i) + b(i) \bmod q$

Set of 2 patterns, R=(m-1)/m

```
0 0
0 0
0 0
0 0
0 0
0 0
0 1
0 1
0 0
0 1
0 1
0 1
0 1
0 0
0 0
0 1
0 1
```
⇧ 1 bit flag Set of 4 patterns, R=(m-2)/m

```
0 0 0 0
0 0 0 1
0 0 0 1
0 0 0 1
0 0 0 1
0 0 1 1
0 1 1 1
0 1 1 1
0 1 1 1
0 0 1 1
0 0 1 1
0 0 1 1
0 0 1 1
0 0 1 1
0 0 1 1
0 0 1 1
0 0 1 1
```
⇧ 2 bit flag

FIG. 4

METHOD AND APPARATUS FOR ADDITIVE TRELLIS ENCODING

FIELD OF THE INVENTION

The present invention relates generally to data storage and communication systems. More particularly, the invention relates to the conversion of data to bit sequences satisfying certain constraints, in particular, preventing the local and global imbalance of zeros and ones in a coded binary sequence. The invented method, codes and apparatus are also related to the area of the weakly constrained DC-free (WDCF) codes.

BACKGROUND OF THE INVENTION

In storage systems such as optical and magnetic storage systems, as well as in some communication systems, user data are usually first encoded by an outer Error Correcting Code (ECC), then encoded by a modulation encoder, and finally optionally encoded by an inner channel encoder. The modulation encoder could be of the Run Length Limiting (RLL) type, the Running Digital Sum limiting (RDS) type or the Direct Current Free (DCF) type. The output of the modulation encoder (or the inner channel encoder if used) can be pre-coded before being recorded onto the media and read by the detector. On the detection side, a Viterbi algorithm is usually used to reconstruct the coded bits. The primary task of the modulation code is to facilitate the front-end stages of the channel, such as a preamp, a timing circuit, an equalizer and others. At the same time, the modulation encoder modifies the distance properties of the output code words of the channel, and therefore can also improve the Bit Error Rate (BER) and Sector Failure Rate (SFR) characteristics of the system.

The conventional modulation codes described in the literature usually employ a state transition diagram. In a finite state encoder, arbitrary user data are encoded to a constraint data sequence via a finite-state machine. The encoder is said to have rate m/n if at each step of the encoding process, one m-tuple of user data is encoded to one n-tuple of constraint data in such a way that the concatenation of the encoded n-tuples obeys the given constraint. The finite-state machine has multiple states, and the encoder or decoder moves from one state to another after the generation of each output tuple. A single error in the received sequence can trigger the generation of wrong states in the decoder, and in result produce a long sequence of errors. This phenomenon is called "error propagation", and is often related to the modulation codes constructed from finite-state machines. For the purpose of limiting error propagation, decoding can be implemented via a sliding-block decoder. The state-splitting algorithm can be used for designing the finite state encoders for small and moderate values of n, but for large values of n, it usually requires the use of large tables assigning data to codewords in the encoding graph, and is not feasible from a practical point of view.

Recently, various types of iterative detection schemes based on turbo codes, low density parity check (LDPC) codes and turbo product codes (TPC) were developed for application in storage and communication systems. They provide very low BER, but usually require the use of an interleaver after the modulation encoder. An interleaver changes the order of the already coded bits, and in result nullifies the operation of the modulation encoder. Since encoders based on finite state machines transform the data bits using mapping tables without special structure, the use of such codes in channels with interleaving coded bits is impossible or severely restricted, especially, when they are applied for the encoding parity bits of the TPC or LDPC codes.

Embodiments of the present invention provide solutions to these and/or other problems, and offer other advantages over the prior art.

SUMMARY OF THE INVENTION

A method of additive encoding of data words includes receiving a plurality of data words, searching a trellis representation of patterns to be used for subsequent modification/encoding of the data words, and additive encoding of the data words using an optimal or sub-optimal sequence of patterns found by the trellis search. The states of the trellis are associated with groups of flags representing different matching patterns. An optimal or sub-optimal sequence of patterns is identified by a survived path between the initial and final states of a trellis representing all possible combinations of matching patterns. The trellis representation can comprise all possible combinations of matching patterns which can be used in a sequence of additive code words. In other words, the trellis representation of matching patterns is searched to identify a sequence of flags representing the sequence of patterns to be used to encode the data words.

Other features and benefits that characterize embodiments of the present invention will be apparent upon reading the following detailed description and review of the associated drawings.

BRIEF DESCRIPTION OF THE DRAWINGS

FIG. 4 is an illustrative example of two sets of matching patterns.

FIG. 7-1 is an illustrative example for the definition of the search metric.

FIG. 7-2 is a block diagram illustrating a method of the present invention.

FIG. 7-3 is a block diagram illustrating a more particular embodiment of the modulation encoder shown in FIG. 2.

FIG. 7-4 is a block diagram illustrating a more particular embodiment of methods and systems of the present invention.

DETAILED DESCRIPTION OF ILLUSTRATIVE EMBODIMENTS

As noted above, various types of iterative detection schemes based on turbo codes, LDPC codes and TPC have been developed for use in storage and communication systems. These iterative detection schemes usually require the use of an interleaver after the modulation encoder. An interleaver changes the order of the already coded bits, and in result nullifies the operation of the modulation encoder. Since encoders based on finite state machines transform the data bits using mapping tables without special structure, the use of such codes in channels with interleaved coded bits is impossible or severely restricted, especially, when they are used to encode parity bits of TPC or LDPC codes. The present invention is directed to a new class of such modulation codes and corresponding encoders and decoders. The resulting encoding methods and apparatus are well suited for such applications, since they are based on simple component wise modulo q operations.

The above mentioned problems are addressed in the current invention where a method of, and apparatus for, additive trellis encoding are provided. The encoding method uses a sequence of matching patterns, chosen from a predefined set, which is added component wise modulo q to the original data. A sequence of flags is also sent to the receiver to identify the used sequence of the matching patterns. A trellis search algorithm for the optimized choice of the sequence of flags is also provided. A new metric utilizing the two variances corresponding to the positive and negative values of the RDS are used to search for the "best" sequence of flags (matching patterns). Results of tests and simulations have demonstrated the efficiency of the encoding schemes, the trellis search algorithms and the new metric of the present invention.

Figure 1:
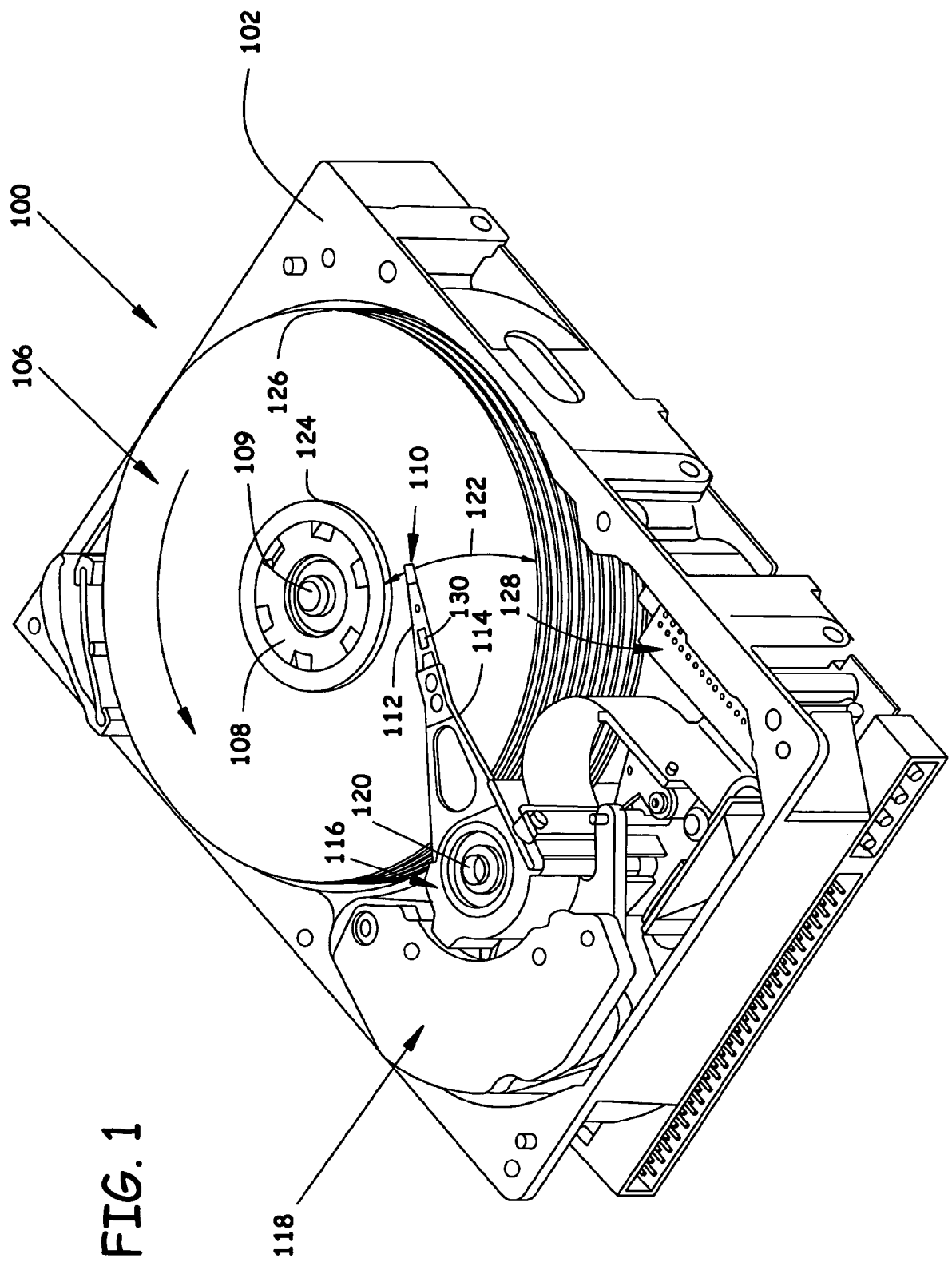
FIG. 1 is an isometric view of a disc drive.

The present invention can be used, for example, in data storage systems and/or communication systems. For example, FIG. 1 is an isometric view of a disc drive 100 in which embodiments of the present invention are useful. Disc drive 100 includes a housing with a base 102 and a top cover (not shown). Disc drive 100 further includes a disc pack 106, which is mounted on a spindle motor (not shown) by a disc clamp 108. Disc pack 106 includes a plurality of individual discs, which are mounted for co-rotation about central axis 109. Each disc surface has an associated disc head slider 110 which is mounted to disc drive 100 for communication with the disc surface. In the example shown in FIG. 1, sliders 110 are supported by suspensions 112 which are in turn attached to track accessing arms 114 of an actuator 116. The actuator shown in FIG. 1 is of the type known as a rotary moving coil actuator and includes a voice coil motor (VCM), shown generally at 118. Voice coil motor 118 rotates actuator 116 with its attached heads 110 about a pivot shaft 120 to position heads 110 over a desired data track along an arcuate path 122 between a disc inner diameter 124 and a disc outer diameter 126. Voice coil motor 118 is driven by servo electronics 130 based on signals generated by heads 110 and a host computer (not shown).

While a particular disc drive is shown, disc drive 100 is intended to represent any of a variety of data storage devices in which the methods and apparatus of the present invention can be implemented. For example, in other embodiments, disc drive 100 can be other types of magnetic disc drives, or can be other types of non-magnetic disc drives such as an optical disc drive, a magneto-optical disc drive, etc. The methods and apparatus disclosed herein can also be used in other data storage devices, for example in magnetic tape storage devices. Further still, the methods and apparatus of the present invention can be used in environments other than data storage systems. For instance, the methods and apparatus of the present invention can also be used in communication systems. The following discussion, though directed specifically to data storage systems at times, is intended to be applicable to all such uses of the present invention, and disc drive 100 is intended to generally represent various types of data storage systems and communication systems in which the present invention can be practiced.

1. Example Channel Circuitry

Figure 2:
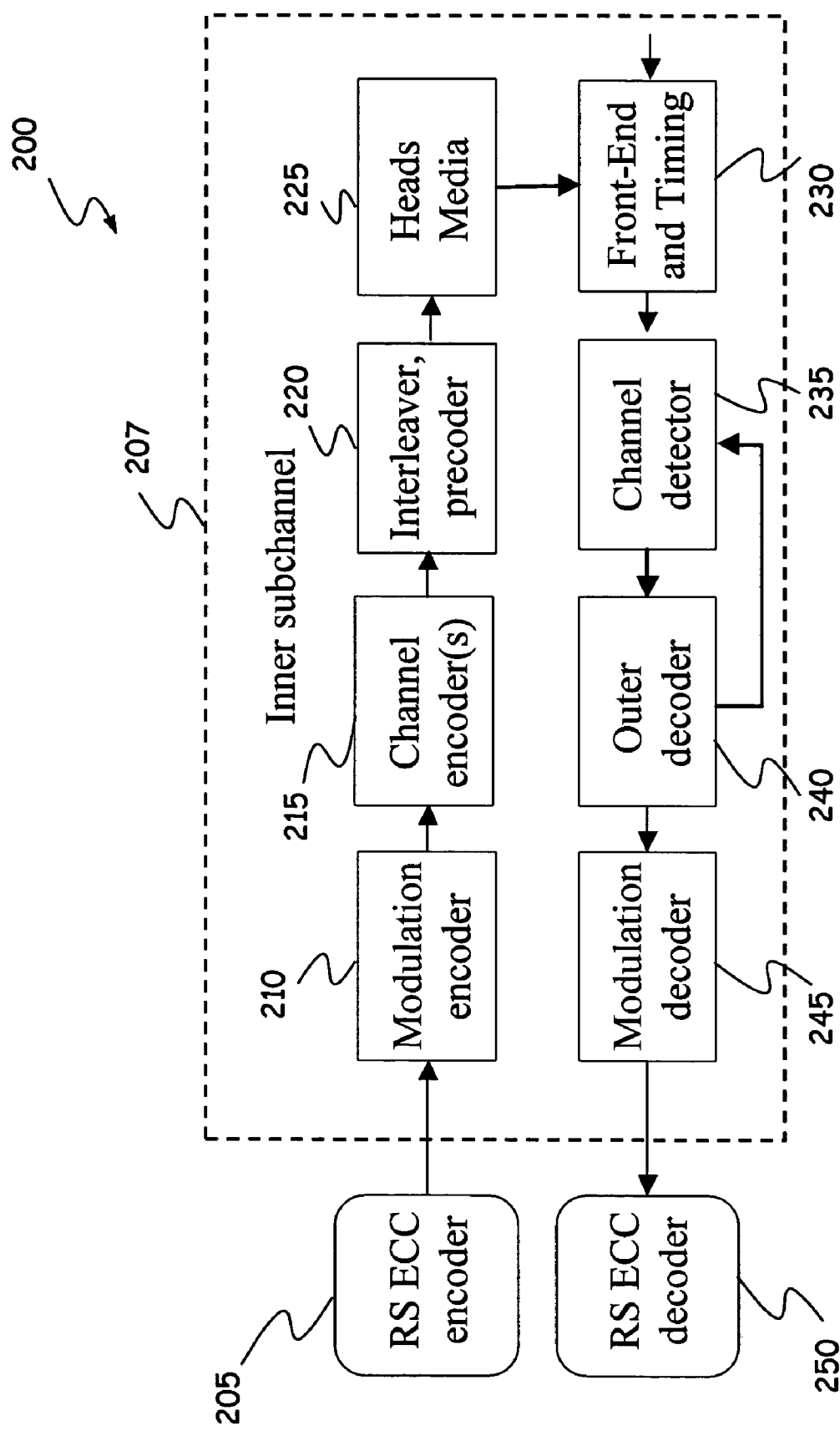
FIG. 2 is a block diagram illustrating a read channel architecture in which the embodiments of the present invention can be implemented.

The present invention is particularly useful in read/write channels of data storage systems such as magnetic and/or optical disc drives. FIG. 2 is a block diagram of an illustrative embodiment of such a channel. While channel or channel circuitry 200 is discussed with reference to data storage systems, those of skill in the art will understand that the illustrated encoding and decoding portions can be separated into transmitting and receiving channels of a communication system, with the heads/media and other blocks replaced with transmitter and receiver circuitry.

Channel 200 includes a number of different encoding/decoding circuits, each encoding or decoding data in different manners for different purposes. The various circuits shown in the blocks of FIG. 2 can be implemented as integrated circuits, discrete components, or suitably programmed processing circuitry. The present invention relates to methods implemented within modulation encoder circuitry 210 and modulation decoder circuitry 245. In exemplary embodiments, the present invention relates to DCF encoder and the DCF decoder embodiments of modulation encoder circuitry 210 and modulation decoder circuitry 245.

The following discussion of channel 200 provides a general understanding of a typical environment in which the modulation encoder methods of the present invention can be implemented, but is not intended to limit the invention to any particular channel configuration or functionality. Assume that data bits of a message word to be recorded on the recording media (heads/media 225) are provided to Reed-Solomon (RS) error correcting code (ECC) circuit 205. Error correcting code circuit 205 introduces additional bits to the message data bits. The additional bits improve the ability of the system to recover the signal when the encoded signal has been corrupted by noise introduced by the recording channel. Also, channel circuitry 200 shown in FIG. 2 includes an RS ECC decoder circuit 250 in order to decode data read back from the heads/media 225 in a known manner.

Within the inner sub-channel 207 modulation encoder 210 is included to implement an additive coding scheme for encoding the data received from ECC encoder 205. Note that ECC encoder 205 is optional in some embodiments, and that generally modulation encoder 210 performs additive encoding on data it receives, without limitation to ECC encoded data. As used herein, references herein to data words received at the input of modulation encoder 210 are intended to include either of un-encoded data and previously encoded data to DCF additive encoding is to be applied. As will be described below in detail, modulation encoder 210 is configured to implement a trellis search algorithm to search code pattern flags for a best pattern to add to a message or data word to provide a code word as an output. Modulation decoder 245 determines, based on the flags of the code words, which patterns to again add to the code words to retrieve the data originally encoded by modulation encoder 210.

Channel encoder(s) 215 and interleaver/precoder 220 represent optional additional encoders and interleavers of the types known in the art which use known encoding schemes to encode the data from modulation encoder 210. For example, channel encoder(s) 215 can include TPC encoders, LDPC code encoders, etc. As a further example, circuitry 220 can optionally include a precoder used to implement a code of rate 1/1. Generally, a precoder is used to eliminate catastrophic error events and/or to convert the data from binary to another format such as bipolar. Front-end and timing circuit 230 filters and converts an analog read back signal from the heads/media 225 into a digital signal, providing timing for sampling of the read back signal. Channel detector 235 and outer decoder 240 can, in some embodiments, function together to convert the digital signal into a binary (i.e., 1's and 0's) signal. Again, the modulation encoder 210 and corresponding additive trellis encoding and search methods of the present invention, which the encoder is configured to implement, are not limited to use with the other components or configurations shown in FIG. 2.

2. Generic Additive Coding Scheme

The necessity of data modification arises usually during encoding when an encoder gets side information from a channel or other source which defines new temporary requirements for a code word to be generated at the current moment of time. The side information could be a constraint of an RLL type, an accumulated RDS, a maximum value of the RDS in the past, or other metric. When the side information is quantified, it can be considered as a current state of a channel. In an additive coding scheme, an encoder 210 uses a predefined set of special words called "patterns," and chooses one of the patterns in the set for each data word of the same length according to some criteria, when a state of the channel is given. The different patterns in the set are identified or distinguished using one or more flag or prefix bits. Then, the data word and pattern are added component wise modulo 2 if the input and output alphabets of the channel are binary, and sent to the channel. A standard sector of the magnetic recording system can consist of N>70 code words of the length n in bits of 20<n<100. Therefore, even for the single bit flags when two patterns are used to encode one code word, the total number of flag combinations to encode N data or message words is greater than $2^N$ (each of the N data or message words can be encoded using one of the two patterns to obtain the resulting code word), and cannot be searched in a brute force manner due to processing and time limitations. It is a non-trivial problem to find what patterns are to be used, and how to optimize their choice in a long sequence of additive coding steps. The present invention provides a search method using a trellis which is similar to the Viterbi algorithm usually used for decoding purposes, but in fact is different from the Viterbi algorithm. To better understand the invention, a formal description of a generic additive coding scheme is provided.

Let q be a positive integer, and $E=\{0,1,2,\ldots,q-1\}$. An additive code $B=\{B_1, B_2, \ldots, B_M\}$ for the transmission of $M=q^m$ messages through a channel with the input and output alphabets $E^n$ is defined by:

Set C of $L \leq q^{n-m}$ matching patterns $\bar{c}=(\bar{a},\bar{b}) \in E^n$ with distinct prefixes $\bar{a}$ of length r=n-m, and Data set U of M words $\bar{u}=(\bar{0},\bar{u}') \in E^n$, where $\bar{0}$ is the prefix consisting of r zeros, and $\bar{u}'$ is the q-ary representation of a message $u=1,2,\ldots,q^m$.

An additive code $B=\{B_u\}$ has the following structure:

$$B_u = \{\bar{u} \oplus \bar{c} | \bar{c} \in C\} \qquad \text{Equation 1}$$

for each message word $u \in U$. Using Equation 1, it can be seen that:

$$B_i \cap B_j = \emptyset, \ 1 \leq i \neq j \leq M. \qquad \text{Equation 2}$$

Figure 3:
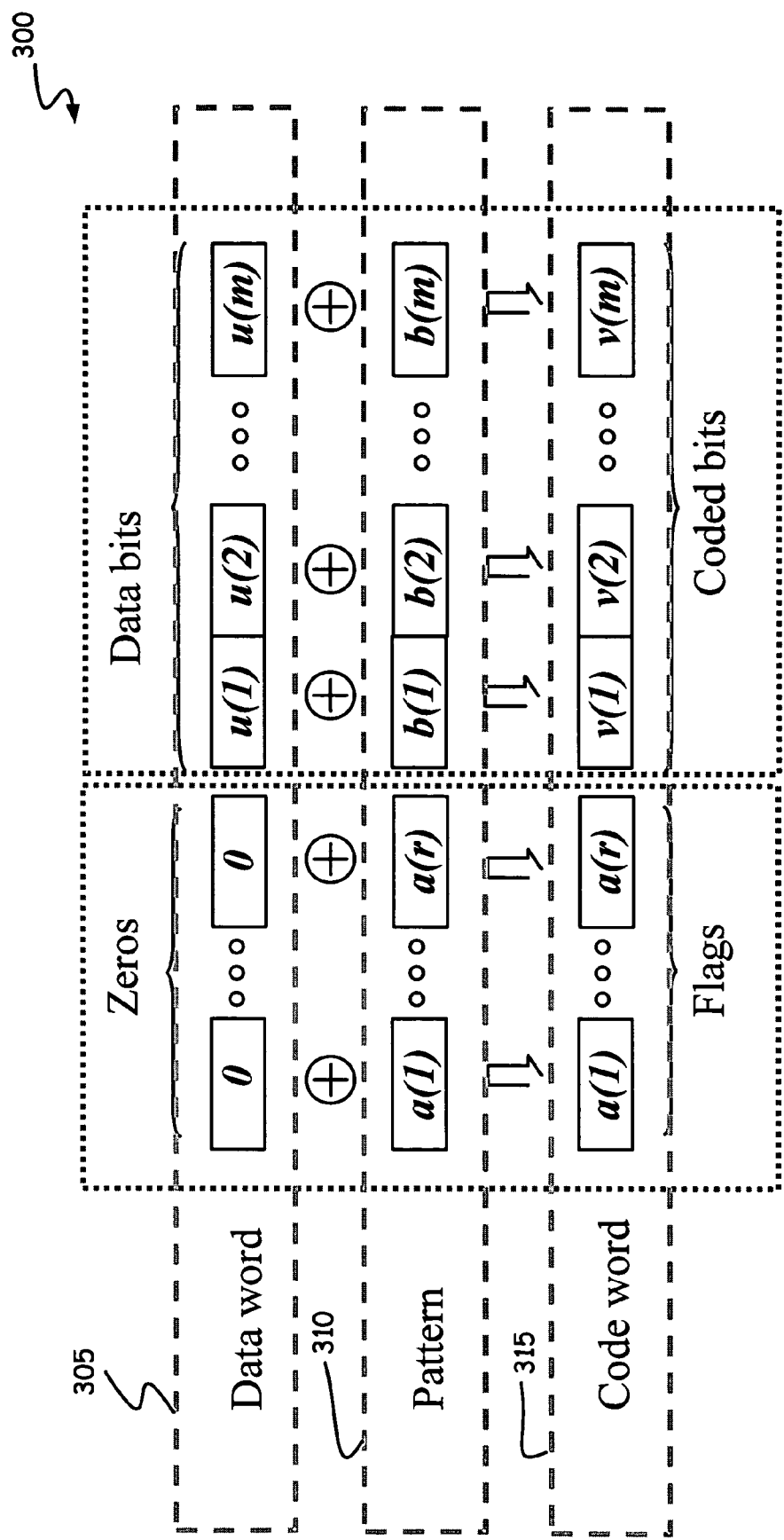
FIG. 3 is a block diagram illustrating generation of a code word in the additive coding scheme.

FIG. 3 shows an encoding process/component defined by Equation 1. In FIG. 3, component wise modulo q adder 300 is used to add the bits of a data word 305 to the bits of a selected pattern 310 to obtain a code word 315. The data bits u(i) of the data word are added to the pattern bits b(i) of the pattern to obtain the coded bits v(i). The encoding equation is illustrated at the bottom of FIG. 3. The flag bits or prefix bits a(j) of the pattern 310 are added to zeros appended to the data word 305 such that the code word 315 is identified by the same flag bits a the pattern 310. To illustrate the notion of a set of matching patterns, in FIG. 4 two examples of matching sets with 2 and 4 patterns are presented. Note that, in contrast to a conventional ECC or RLL code, in an additive coding scheme each message u is assigned a set of code words $B_u$, and according to the current state of a channel $s \in S$ one of the code words from $B_u$ is used to transmit or store the given message u.

In order to increase the rate of an additive code R=(n−r)/n, the minimal possible number of matching patterns should be used. The Lemma from Appendix A included below provides the answer to the question of how many patterns are required for the absolutely reliable transmission of m q-ary symbols over a constraint deterministic channel with a given set of states S known to the encoder, but unknown to the decoder. Given a masking set C satisfying the conditions of the Lemma from the Appendix A, one can encode and decode as follows:

Encoding step. According to the Lemma from Appendix A, $B_u \cap Y_s \neq \emptyset$ for any $u \in U$ and $s \in S$. Therefore, for any message u and any state s there is a pattern $\bar{c} \in C$ such that the code word $x(u,s)=\bar{u} \oplus \bar{c} \in B_u \cap Y_s$. In other words, by simple component-wise additive operations one can always generate a code word x(u,s) which belongs to the set of words $Y_s$ transmitted through the channel without errors. This code word x(u,s) represents the message u.

Decoding step. According to the Equation 2, $B_i \cap B_j = \emptyset$ for all $1 \leq i \neq j \leq M$. Therefore, all $\bar{v} \in B_u$ are just to be decoded into the output message u. Practically, in the additive coding scheme this can be done by the following manner:

The prefix $\bar{a}$ of the received word $\bar{v}$ determines the pattern $\bar{c}$ used during encoding, and therefore can be used to recover $\bar{c}$.

By component-wise modulo q addition of $\bar{c}$ and the received word $\bar{v}$, one can get the data word $\bar{u}$ which contains the original data bits in the last m positions.

If the number of patterns in the set C is not sufficient to guarantee the error-free transmission through the constraint channel, or to satisfy the channel input constraints at the current moment of time, the best possible pattern in the given set C must be chosen, and a metric is required to determine which combination of the $2^N$ possibilities is "the best". Examples of such metrics are provided below.

3. Trellis Encoder for the Search of Flag Bits.

Figure 5:
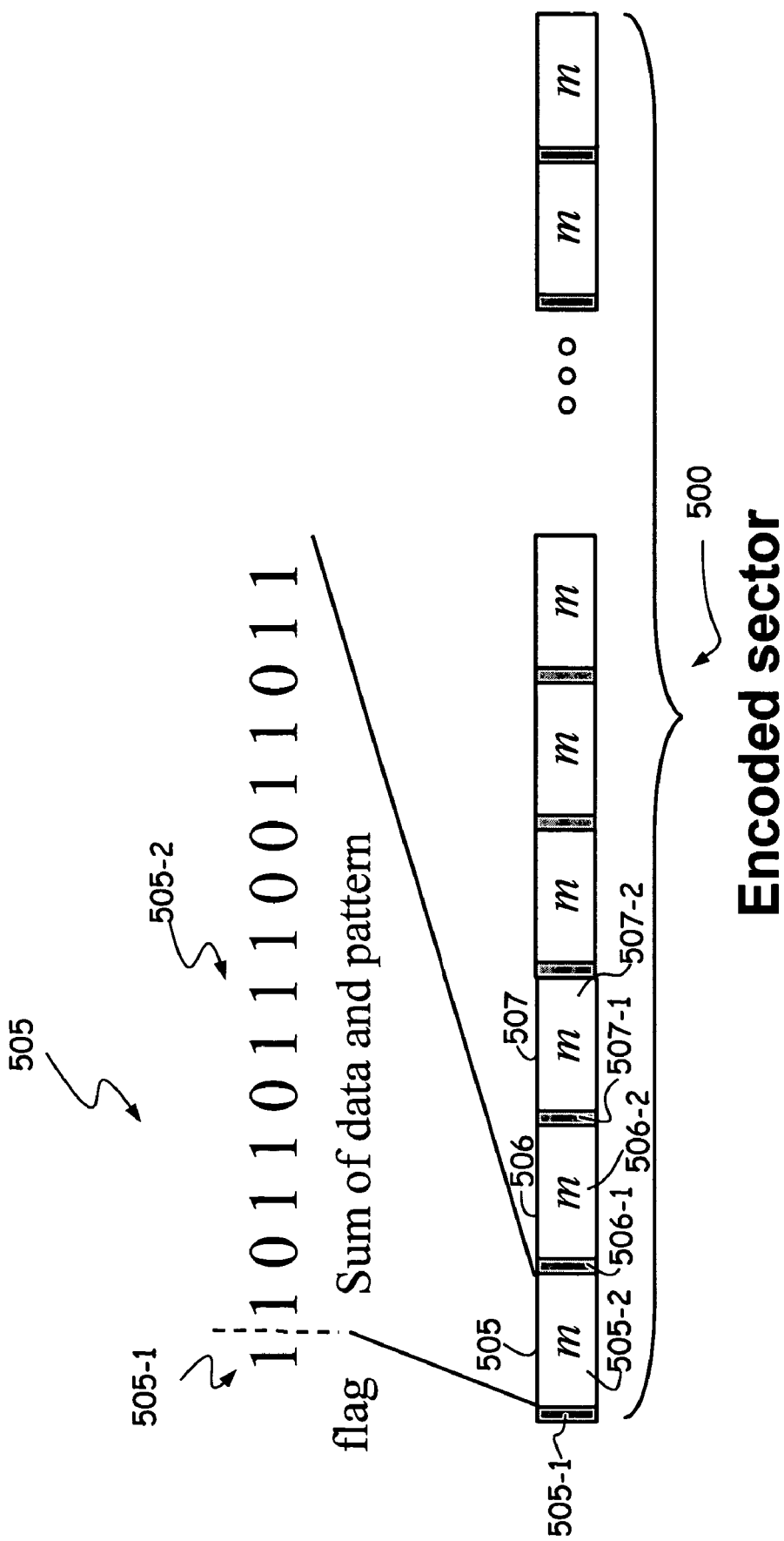
FIG. 5 is the block diagram illustrating the structure of a sector in the additive coding scheme.

Now, a description is provided of an application of additive coding in a magnetic recording channel (or other type of channel) when the suppression of the DC content of a signal is required. As shown in FIG. 5, in the proposed scheme the coded sector 500 is concatenated from the relatively short code words 505, 506, 507, etc. Each code word, of length n=m+r, is generated by the additive coding scheme shown in FIG. 3, where r is the number of redundant bits used as flags to enumerate matching patterns. In FIG. 5, the r bits of each code word used as flags or prefixes are shown at 505-1, 506-1, 507-1, etc, while the m bits of each code word corresponding to the encoded data are shown at 505-2, 506-2, 507-2, etc.

In the magnetic recording channels it is difficult to compensate the rate loss, and for this reason the use of a high rate code is desirable. Although the technique described below works well with an arbitrary number of redundant bits r, an encoding scheme with one redundant bit per a code word of length n, i.e., with the rate R=(n−1)/n, is described in detail. One redundant bit can be used to enumerate two patterns. When one of the patterns consists of all zeros and other pattern is nonzero, it can also be said that the redundant bit is a flag showing if a nonzero pattern is used or not. Note that the addition of the all zero pattern to the original data leaves an original data "as is". All generalizations for the multiple matching patterns are strait forward.

4. Description of a Trellis.

Let N be the number of additive code words in a sector. In the specific implementation of an additive trellis scheme with a single bit flags (only one nonzero pattern is used), the number of flags in the sector is also equal to N. Let v be a small integer parameter. By partitioning the sequence of flags into blocks consisting of v bits (the last block may have less than v bits), the task of flag searching can be reduced to determining $\lfloor N/v \rfloor$ blocks of flags (here, $\lfloor x \rfloor$ denotes the smallest integer greater than or equal to x). When the blocks of flags are represented by the nodes of the trellis they are also called states of the trellis. In other words, the state of a trellis is a group of v flag bits, and there are $2^v$ different states for the given parameter v. Therefore, in order to represent all possible combinations of N single bit flags in the coded sector, we need a full trellis with $\lfloor N/v \rfloor$ sections each consisting of $2^v$ states connected by edges with the neighbor states. In the full trellis each state is connected by edges with all directly preceding and following states. For v=2 the trellis is shown in FIG. 6.

Note that if an additive code uses L>2 patterns, the flag consists of r>1 bits. The total number of bits in N flags is equal to rN. In this case, it is convenient to choose v as a multiple of r, so that an integer number of flags forms a state of a trellis. The trellis will have the same number $2^v$ states, but rN/v sections.

Figure 6:
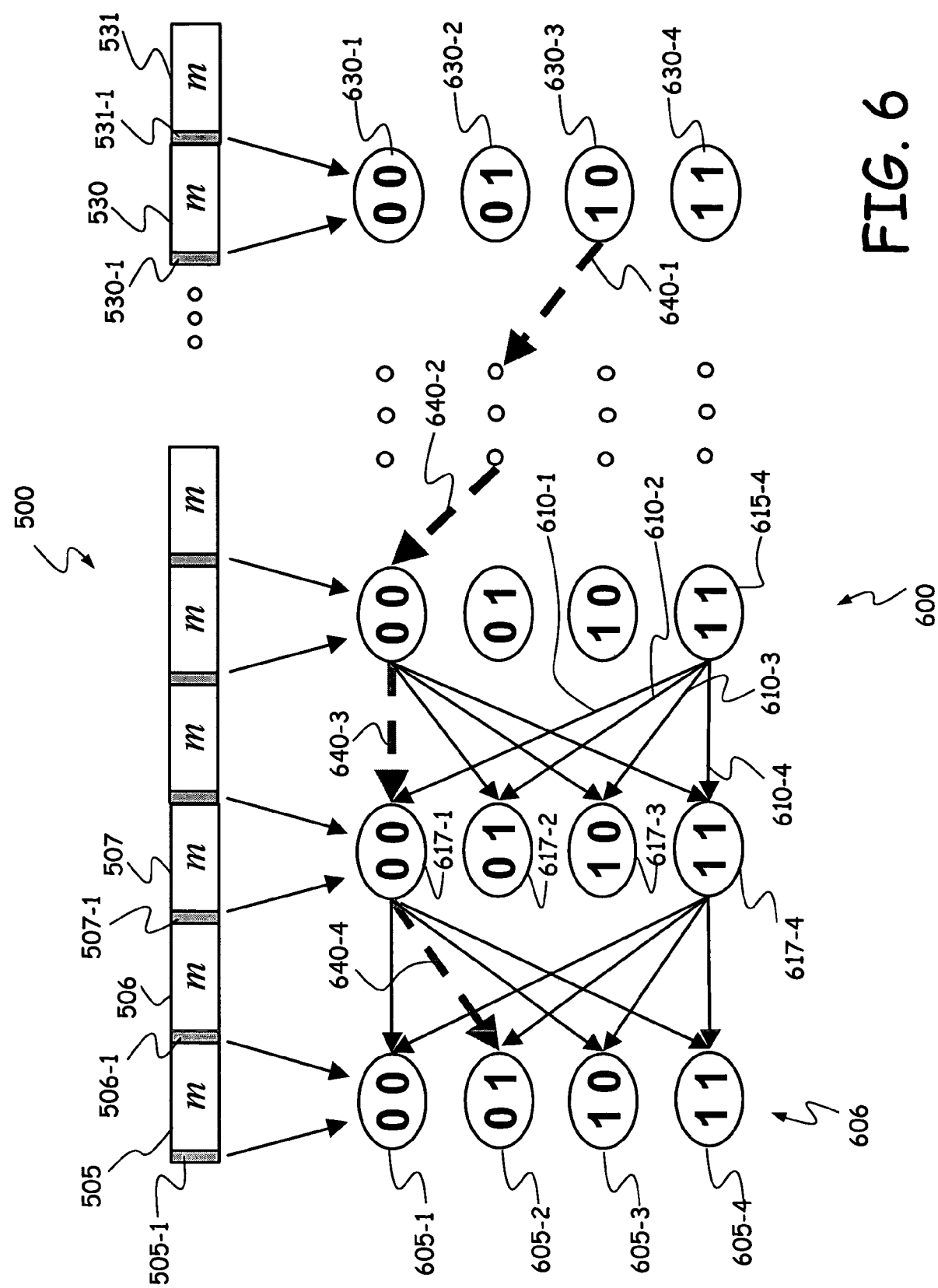
FIG. 6 is the block diagram illustrating a trellis used for the search of an optimized sequence of matching patterns.

As described, in the example trellis 600 shown in FIG. 6, each node corresponds to a group of 2 adjacent flags from coded sector 500. Similar to the illustration in FIG. 5, coded sector 500 is represented as a series of code words (code words 505, 506, 507 . . . 530, 531, etc) each having flag bits (r=1 flag bit in this example) represented at 505-1, 506-1, 507-1 . . . 530-1, 531-1, etc. The nodes or states of the trellis in this example each represent or contain bits from two flags, though the present invention is not limited to use with such an example trellis. For example, each of the trellis states 605-1 through 605-4 represents one of the four possible combinations of values of single flag bits 505-1 and 506-1. Likewise, each of trellis states 630-1 through 630-4 represents one of the four possible combinations of values of single flag bits 530-1 and 531-1. The various states of the trellis are organized by sections corresponding to the various flag bits which combine to form the states. For example, section 606 shown in FIG. 6 includes the four possible states 605-1 through 605-4 which can be represented using the combination of flag bits 505-1 and 506-1.

As described, each of the trellis states is connected by edges with all directly preceding and following states. As an example, edges 610-1 through 610-4 are the edges between trellis state 615-4 and the four possible following states of the trellis (labeled 617-1 through 617-4). For simplicity of illustration purposes, not all edges in trellis 600 are represented in FIG. 6. As will be described below in greater detail, edges 640-1, 640-2, 640-3 and 640-4 represent examples of survivor edges identified using the search algorithms of the present invention. The survivor edges define the set of patterns to be used to encode the sector of data words. Described below are methods of identifying the path, representing the set of patterns, between the states in the trellis to be used.

5. Metrics for the Trellis Search of Flags.

An additive coding scheme can be used for different purposes, in particular, generation of sequences of bits satisfying certain input constraints. Some important constraints used in theory and practice of magnetic recording (or other types of recording) are related to the notions of the disparity and the RDS of the binary or bipolar word as described below. The disparity of a binary word is the number of ones minus the number of zeros in the word. The disparity of a bipolar word with components +1 and −1 is defined in the same way, i.e., the number of "1"s minus the number of "−1"s in the word. The disparity of a bipolar subsequence from a given instant (t=1) to the current position or time moment t is called the RDS at this time moment, and is denoted as $z_t$=RDS(t). Therefore, RDS(n) at the end of the bipolar word of length n is the disparity of this word. Formally, an RDS function is defined as shown in the following discussion.

Let $\bar{x}=(x_1,x_2,\ldots,x_i,\ldots)$ be a bipolar sequence. Note that the bipolar values −1 and +1 of $x_i$ are often represented by their logical equivalents "0" and "1", respectively. The RDS function is then defined as shown in Equation 3:

$$RDS(t) = z_t = \sum_{i=1}^{t} x_i = z_{t-1} + x_t, \qquad \text{Equation 3}$$

where $z_0$=0. The RDS function of the second order is defined by Equation 4:

$$RDS_2(t)=RDS(t)-RDS(t-1). \qquad \text{Equation 4}$$

The accumulated variance of RDS is defined by Equation 5:

$$\text{var} = \sum_{i=1}^{t} z_i^2.$$

Equation 5

Figures 1, 7:
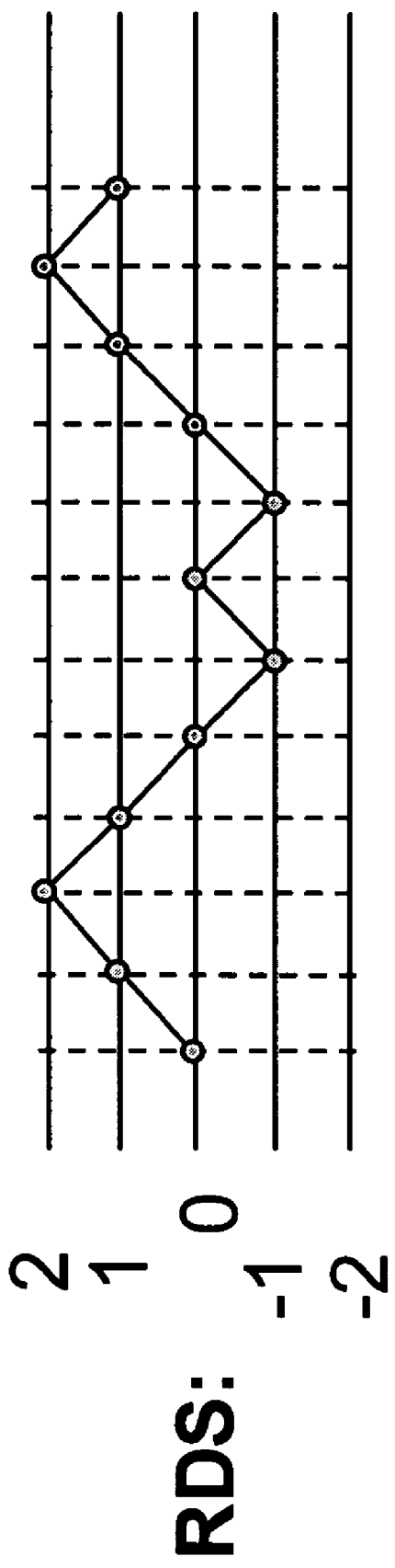
Figures 2, 7:
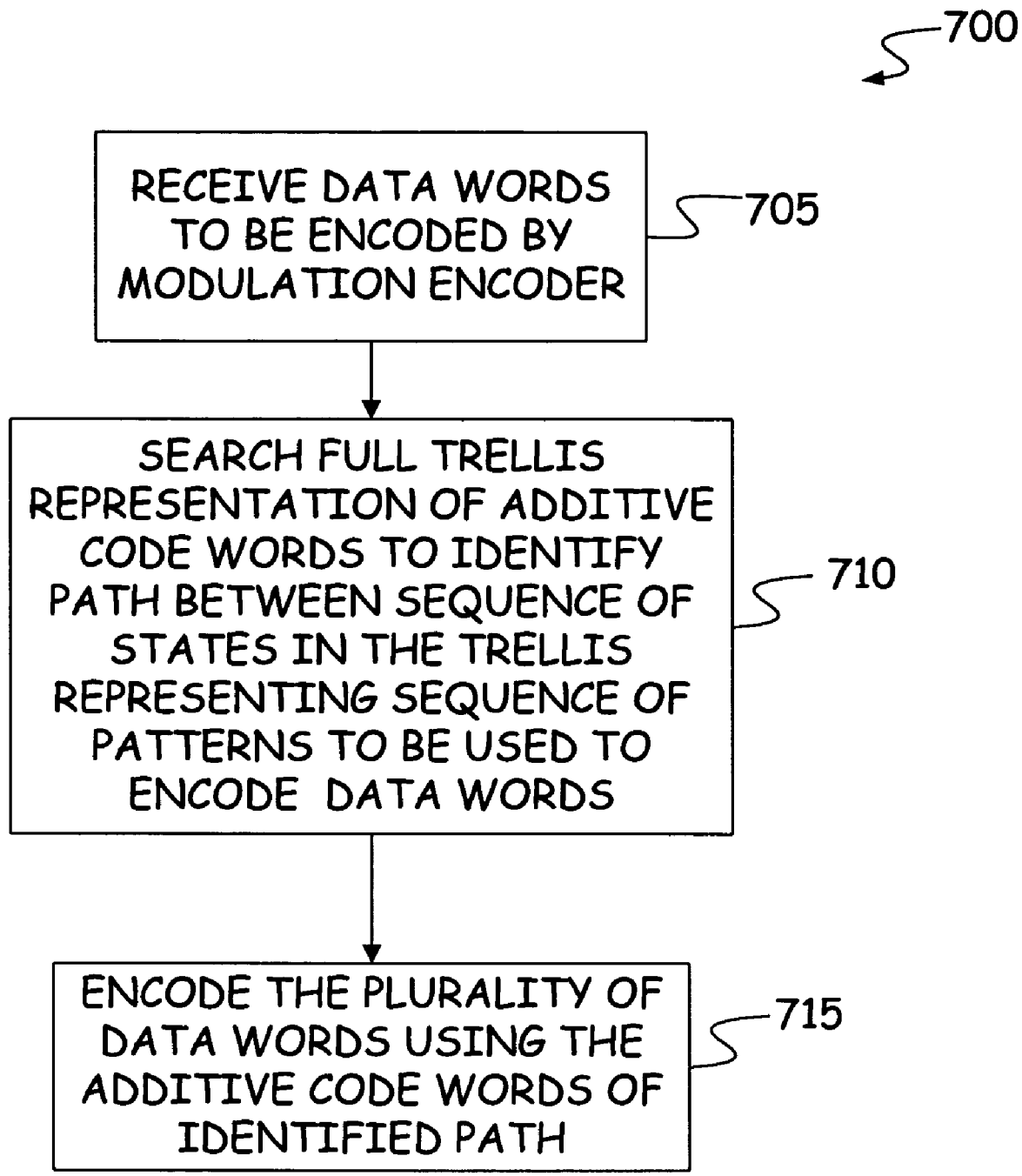
Figures 3, 7:
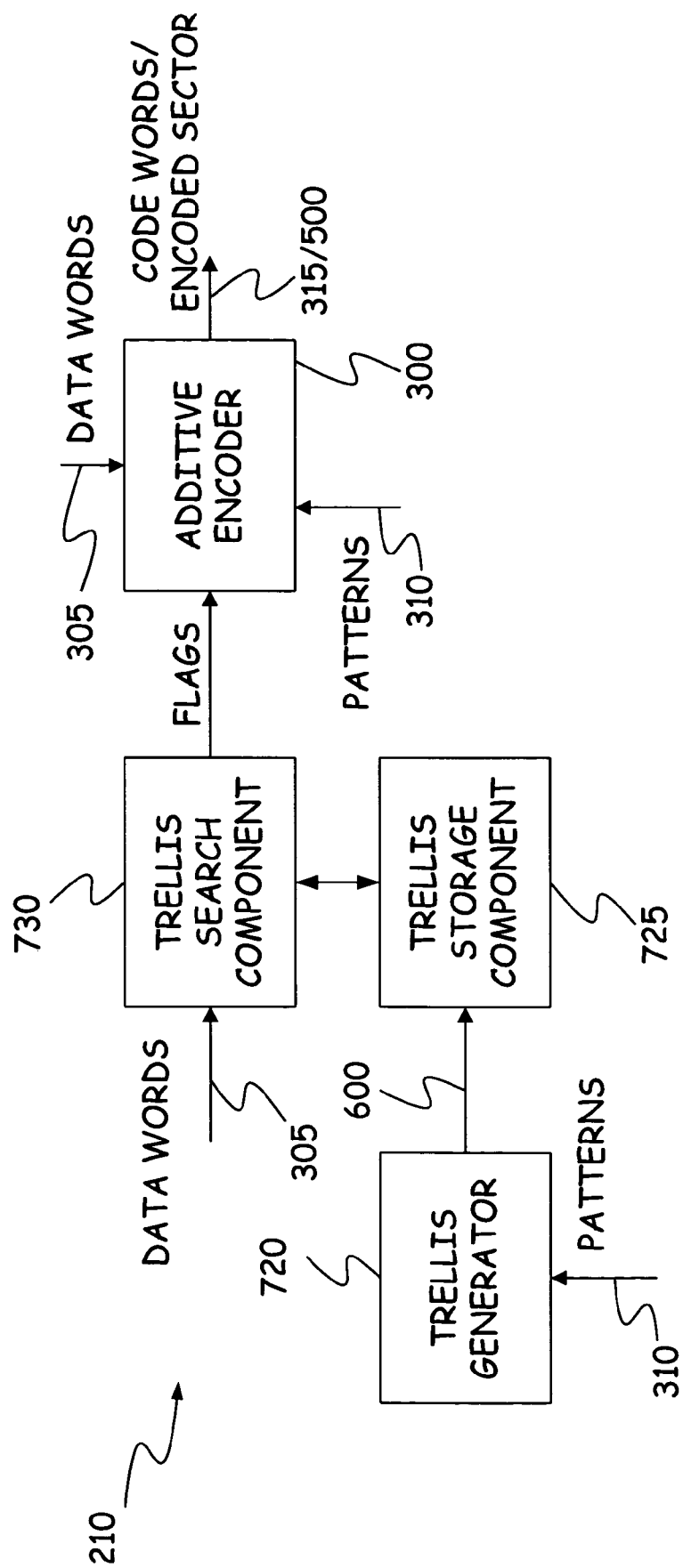

FIG. 7-1 illustrates the notions introduced above for the binary sequence (1, 1, 0, 0, 0, 1, 0, 1, 1, 1, 0) corresponding to the bipolar sequence $\bar{x}=(+1,+1,-1,-1,-1,+1,-1,+1,+1,+1,-1)$. For this bipolar sequences we have $z_1=1$, $z_2=2$, $z_3=1$, $z_4=0$, $z_5=-1$, $z_6=0$, $z_7=-1$, $z_8=0$, $z_9=1$, $z_{10}=2$, $z_{11}=1$, the maximum absolute value of the RDS equals 2, and the accumulated variance equals 14.

In many practical magnetic or other recording systems with AC-coupled preamps, it is not desirable to have signals with the low frequency components that determine the DC-content of a signal. The standard metrics used for the suppression of the DC content include:

Maximum absolute value of the RDS in the coded sector.
Variance of the RDS in the coded sector.
Maximum absolute value of the RDS of the second order, etc.

A new efficient metric for the suppression of DC-content is found and defined as follows. For a given sequence of length N, the positive and negative values of RDS can be distinguished, and the accumulated variance can be split into two components as shown in Equations 6:

$$\text{var}_0(t) = \sum_{i, z_i > 0}^{t} z_i^2, \quad \text{var}_1(t) = \sum_{i, z_i < 0}^{t} z_i^2,$$

Equation 6

Better suppression of the DC-content is achieved when the accumulated variance $\text{var}(t)=\text{var}_0(t)+\text{var}_1(t)$ is minimized under the condition that the absolute value of the difference $\Delta(t)=\text{var}_0(t)-\text{var}_1(t)$ is close to zero. When a scalar metric is required, for example, in the trellis search algorithm to discard some paths and determine a survivor, a weighted function of var(t) and $\Delta(t)$ can be used, defined as follows:

$$\mu(t)=\alpha \cdot f(\text{var}(t))+\beta \cdot g(\Delta(t)),$$

Equation 7 where $\alpha$ and $\beta$ are positive constants, and $f(x)$ and $g(y)$ are some functions.

6. Algorithm for the Trellis Search of Flags.

The present invention includes an algorithm for the search of flags using a trellis such as described above. The algorithm operates or moves sequentially from one section of the trellis to the next until it reaches the last section. While moving along the trellis, the algorithm updates the metrics of the states in each section using the following three memory buffers:

Buffer A, where the metric components of the previous section are stored for each of $2^v$ states;
Buffer B, where the new metric components are formed and stored for each of $2^v$ states in the current section of the trellis; and
Buffer C, a path memory, where for each state the direction to one of the preceding states (called survivors) are stored.

In contrast to a conventional Viterbi algorithm using additive metrics in the decoding process, the main metrics used in the present invention, in particular and for example, the metrics described in the previous section (except the RDS itself and its accumulated variance) are not additive. Therefore, in order to operate with non-additive metrics, in buffers A and B, for each state multiple real values (called metric components) are stored. Examples of the metric components are the maximum value of the RDS in the past, the pair of accumulated variances (var_0(t), var_1(t)) and the final value of the RDS defined earlier. These metrics are calculated for the different states in the trellis as clarified below.

Let $\bar{s}\_t=(s_1,s_2,\ldots,s_t)$ be a sequence of states in the trellis originating at the state $s_1$ at the time moment t=1 and terminating at the state $s_t$ in the section corresponding to the time moment t. This sequence of states, connected by edges, is also called a path in the trellis. The state of a trellis was defined as a block of v flag bits, and therefore when the path $\bar{s}_t$ is given, the first v·t flags and the corresponding matching patterns $\bar{c}_1, \bar{c}_2, \ldots, \bar{c}_{vt}$ are known. These pattern and the data words $\bar{u}_1, \bar{u}_2, \ldots, \bar{u}_{vt}$ define the output binary code word $\bar{v}_1, \bar{v}_2, \ldots, \bar{v}_{vt}$ corresponding to the path $\bar{s}_t$, i.e., $$\bar{v}(\bar{s}_t)=(\bar{u}_1 \oplus \bar{c}_1, \bar{u}_2 \oplus \bar{c}_2, \ldots, \bar{u}_{tv} \oplus \bar{c}_{tv})$$

Equation 8

The metrics of the path originating at the state $s_1$ and terminating at the state $s_t$ are calculated for the code word defined by Equation 8 using the relationships illustrated in Equations 3–7, where $\bar{x}=(x_1,x_2,\ldots,x_i,\ldots)$ is the code word $\bar{v}(\bar{s}_t)$ in the bipolar form.

An embodiment of the search algorithm of the present invention can be described as follows.

Step 1. At the time moment t=1 for each state s∈S, the algorithm calculates and stores in the memory buffer A:
   a) The RDS value RDS(1, s) of the first block of nv bits; and
   b) The metric $\mu(1,s)$ of a code sequence (example metrics include a maximum absolute intermediate value of the RDS, an accumulated variance of the RDS, a metric defined by the equation (7), or other types of additive or non-additive metrics).

Step 2. At the time moments t>1 for each state s∈S in the corresponding section of the trellis, the algorithm analyzes all preceding states s', and defines:
   a) The final value of the RDS(t,s) of the new code sequence consisting of a survivor of the states s' and an extension of a code word defined by the state s;
   b) The metric $\mu(t,s)$ of a new code sequence defined by the states s' and s as described above.

After comparing all preceding states s', the algorithm discards all states s', except one referred to here as the "survivor", and saves the direction to the survivor s' in the path memory. Also, it saves the final value of the RDS and the metric $\mu(t,s)$ corresponding to the new path consisting from the old "survived" path to s' and its extension to the current state s.

Step 3. When the final section of the trellis is reached and processed, the algorithm determines the best final state, and traces back to find the survived sequence of states.

Step 4. The sequence of flags corresponding to the best survived path in the trellis is used in the additive coding scheme to generate an output coded sector.

In summary, as described above, the present invention includes a method or technique for the suppression of the DC-content of signals. It is based on an additive coding scheme combined with and one or more concepts or solutions, such as:

Full trellis representation of all possible combinations of matching patterns used in a sequence of additive code words.

New μ-metric for the suppression of the DC content based on a pair of variances corresponding to positive and negative values of RDS.

Trellis search algorithm for the non-additive metrics, such as maximum value of RDS in the past, new μ-metric mentioned above, and others.

FIG. 7-2 is a block diagram 700 illustrating a general method of the present invention as described above. The method shown in FIG. 7-2 is for illustrative purposes only, and is not intended to limit the invention to the particular embodiment shown. As shown at block 705 in FIG. 7-2, the method includes receiving data words to be encoded by a modulation encoder. Modulation encoder 210 shown in FIG. 2 provides the input for receiving the data words, and is configured to implement the encoding steps shown in FIG. 7-2. As discussed above, in an exemplary embodiment, modulation encoder 210 is a DCF modulation encoder that implements an additive encoding scheme in which code words are generated by adding, modulo q, patterns from a set of patterns to the data words.

As shown at block 710, the method includes searching the full trellis representation of additive code words to identify the best or optimized path between sequences of states in the trellis. This path is the sequence of survivor states identified as discussed above, for example with reference to FIG. 6. The path and corresponding sequence of states in the trellis represent the sequence of patterns to be used to encode the data words. Then, at step 715, the data words are encoded using the additive code words of the identified path. More particular embodiments of these method steps, as well as additional steps, are as described above with reference to FIGS. 2–6 and 7-1.

It must be noted that additive coding, (i.e., adding patterns to the data words) can be started before the search algorithm terminates at the final state, when the flags already produced at the earlier stages of the trellis search are used to choose the matching patterns. Such an implementation can be accomplished using a short path memory, and by the proper choice of the decision delay, the degradation of the characteristics can be reduced to minimum values.

Referring now to FIG. 7-3, shown is a block diagram illustrating a more particular embodiment of the modulation encoder 210 shown in FIG. 2. In this illustrated embodiment, modulation encoder 210 includes a trellis generator or trellis generating circuitry 720, a trellis storage circuit or component 725, a trellis search circuit or component, and an additive encoder 300. Trellis generator 720 receives patterns 310 described above as inputs, and as an output generates trellis 600 (such as shown in FIG. 6). In this embodiment, trellis 600 is stored in trellis storage component 725, which can be, for example, memory contained within the channel electronics or a separate memory device. Trellis search component 730 recieves data words 305 as an input, and searches the trellis representation of additive code words as described above to identify a path in the trellis representing the sequence of patterns to be used to encode the received data words. Trellis search component 730 can be, for example, suitably programmed or configured processing circuitry, hardware, or firmware. Trellis search component 730 provides as an output the sequence of flags representing the sequence of patterns to be used to encode the data words. Then, additive encoder or adder 300 can use these flags to determine which patterns 310 to add to the data words 305 to obtain the code words/encoded sector 315/500. While if desired additive encoder 300 can generate the code words in the manner shown in FIG. 3 to produce an encoded sector 500 as shown in FIG. 5, in other embodiments additive encoder does not repeat the additive operations, but instead selects code words representing the results of the operations from a pre-generated set of possible code words.

7. Protection of Flags by a Local ECC

The disclosed encoding scheme uses multiple flags that are transmitted through the channel and used by the DCF decoder to recover matching patterns. A single bit error in the flag causes the use of a wrong pattern in the DCF decoder, and therefore can produce w output errors, where w is the Hamming weight of the sum modulo q of the correct and wrong matching patters. This does not result in catastrophic error propagation, but still is not a desirable feature in any coding scheme. In the proposed encoding the number of flags is relatively small, and they are separated from each other by a span of "non-flags" of length n−1, where n is the length of a single matching pattern. Therefore, a typical burst of errors at the output of the Viterbi detector produces only a single bit flag error, and a short Hamming is sufficient to correct all single errors. In the low SNR region double errors are also possible, and more powerful ECC codes are to be used to protect flags.

Figures 4, 7:
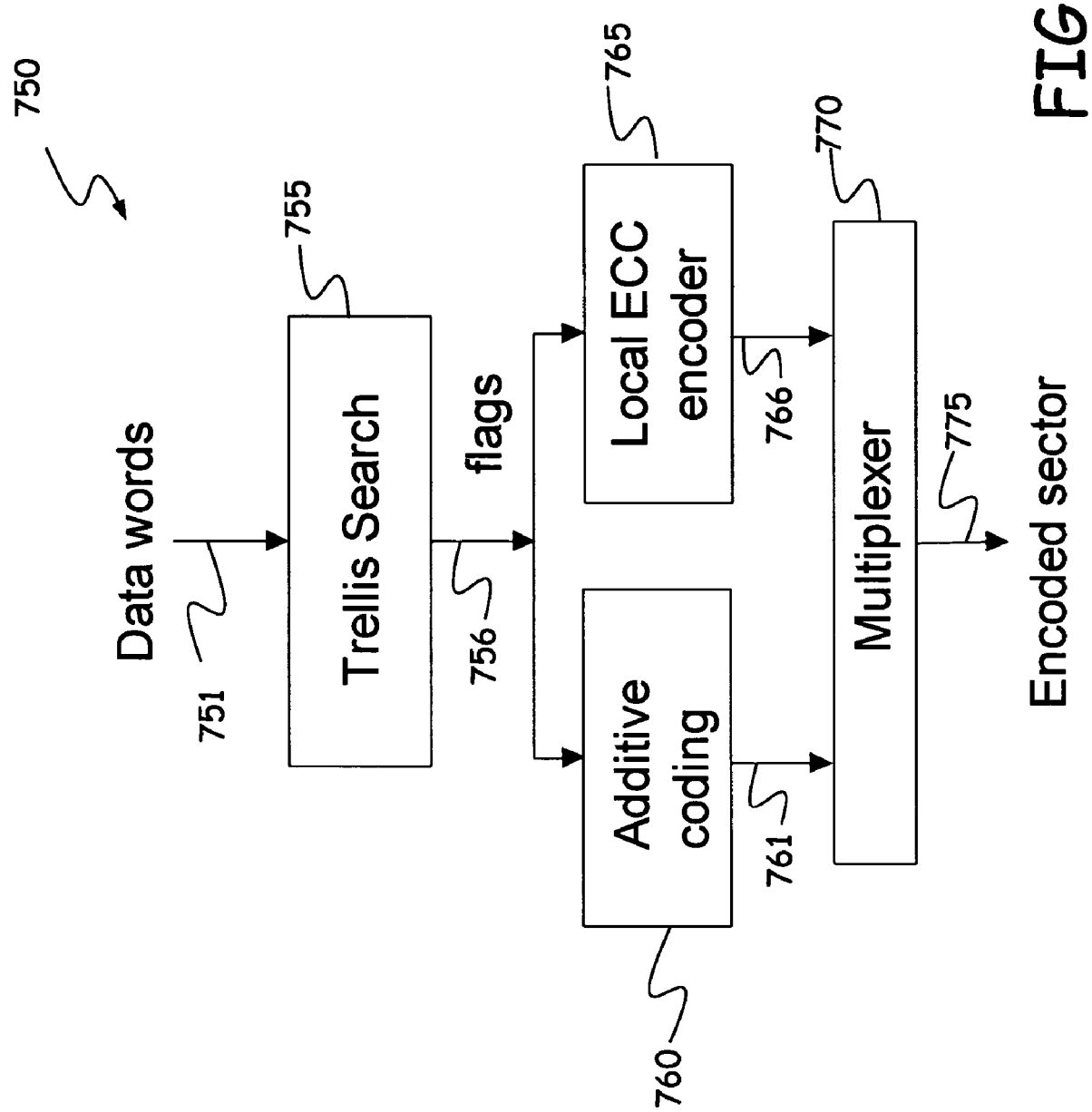

Referring now to FIG. 7-4, shown is a block diagram 750 illustrating more particular embodiments of the methods and systems of the present invention. As illustrated, data words are provided at input 751 to the trellis search implementing circuitry 755, with the result being the flags 756 which are identified in the trellis search. The flags represent the patterns used to additively encode the data words, and thus additive coding circuitry 760 uses the flags to generate additive code words 761 as described above. The additive code words are generated, or are selected from previously generated additive code words, to represent the additive combination of data words with the patterns identified by the flags. As discussed above, the flags 756 can also be provided to a local ECC encoder 765 to generate ECC encoded flags 766, thus protecting the flags. The additive code words 761 and the ECC encoded flags 766 are multiplexed using multiplexer 770 to produce an encoded sector 770.

8. Results of Tests and Simulations

Spectral Properties.

Figure 8:
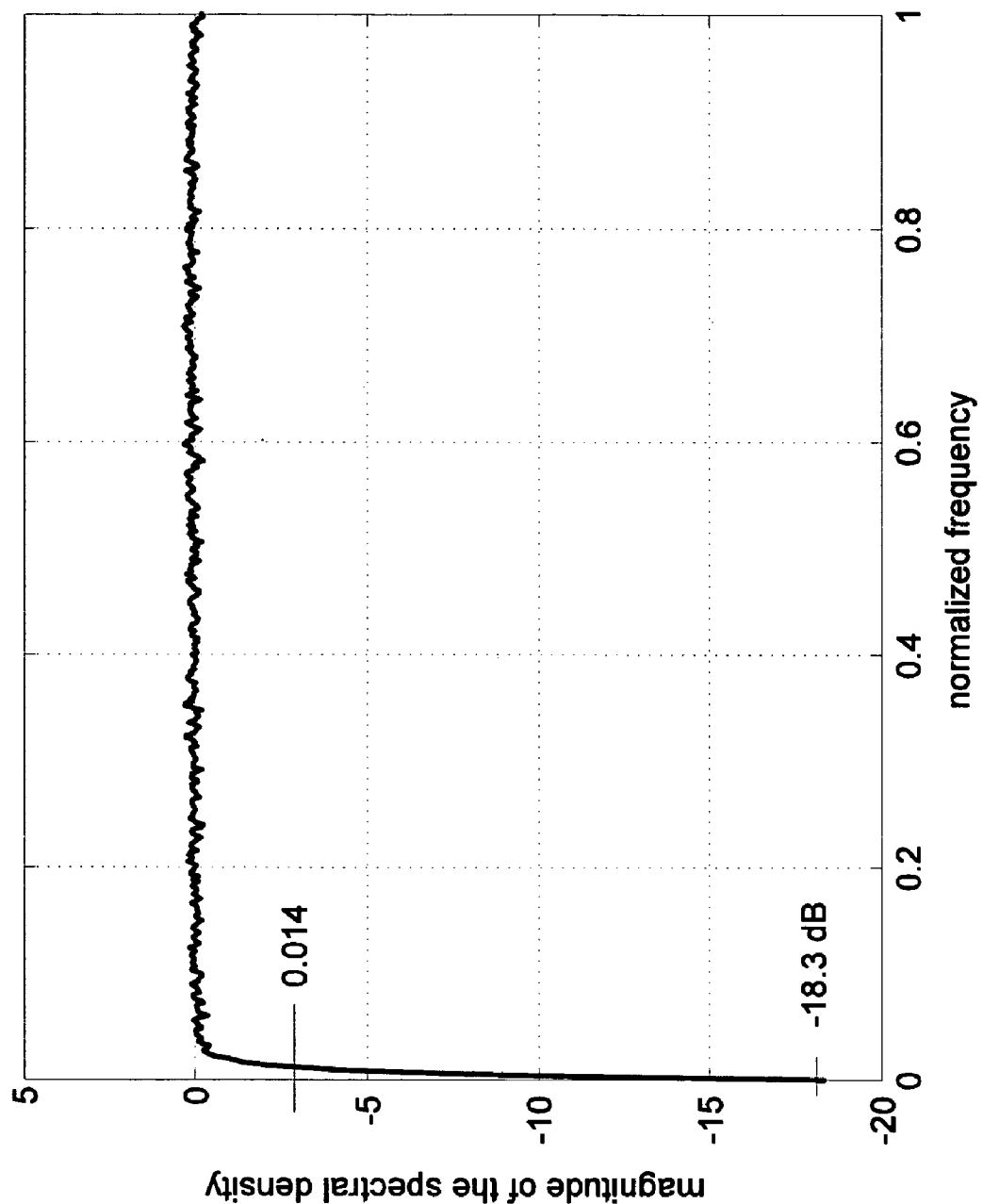
FIG. 8 is an illustrative example of the magnitude of the spectral density of the proposed DCF code.
Figure 9:
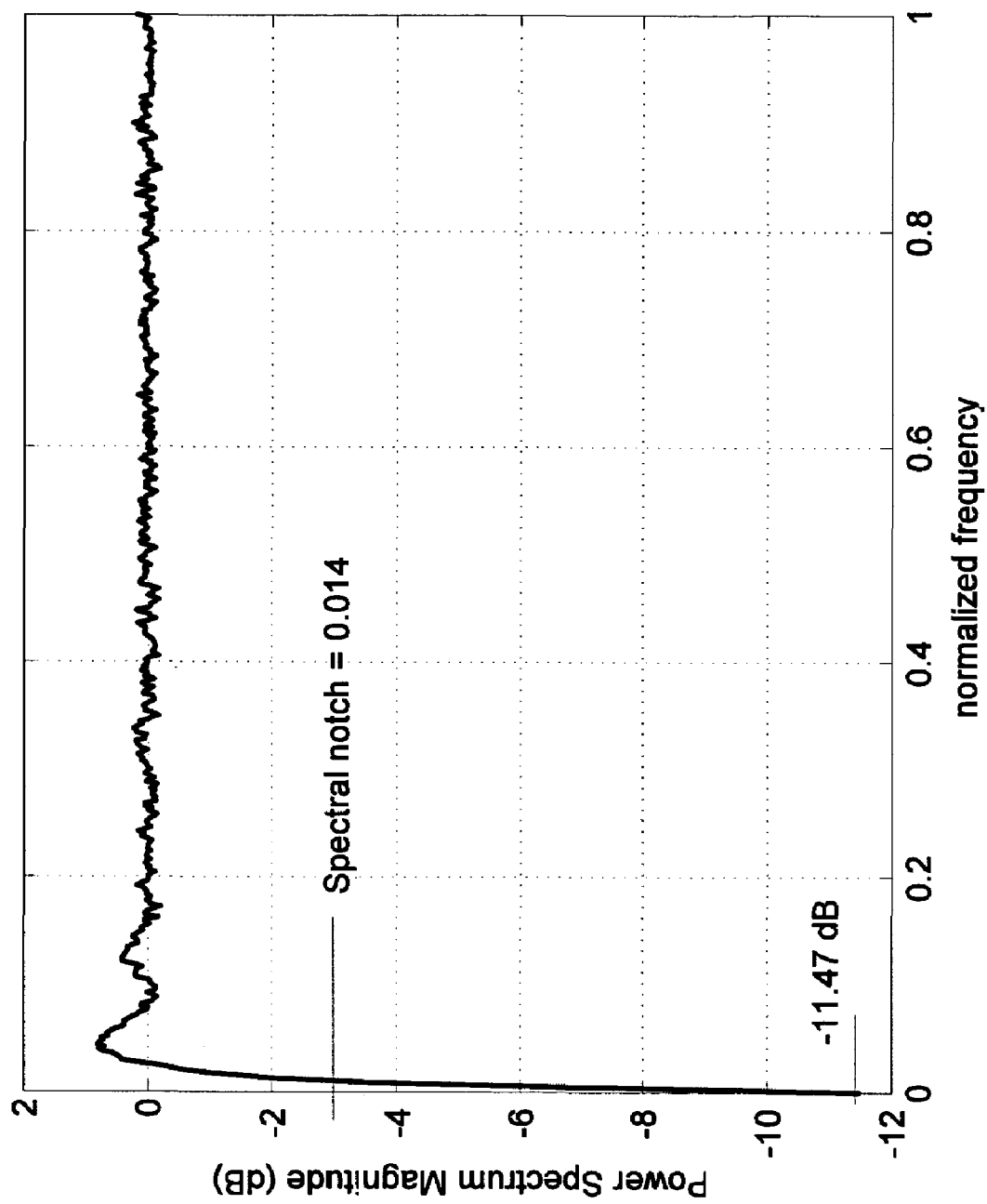
FIG. 9 is an illustrative example of the magnitude of the spectral density of the existing DCF code.

FIG. 8 shows the magnitude of the spectral density of coded sequences used in the designed "TPC16+DCF" scheme. For comparison, in FIG. 9 shown is the magnitude of the spectral density of the existing DCF code. As can be seen from these figures, the DCF codes proposed in the present invention have a much smaller first sample of the power spectrum magnitude (PSM), i.e., −18.3 dB compared with −9.0 dB of existing code. Both codes have approximately the same spectral width at the level −3.0 db.

Results of the Error Propagation Test A.

Figure 10:
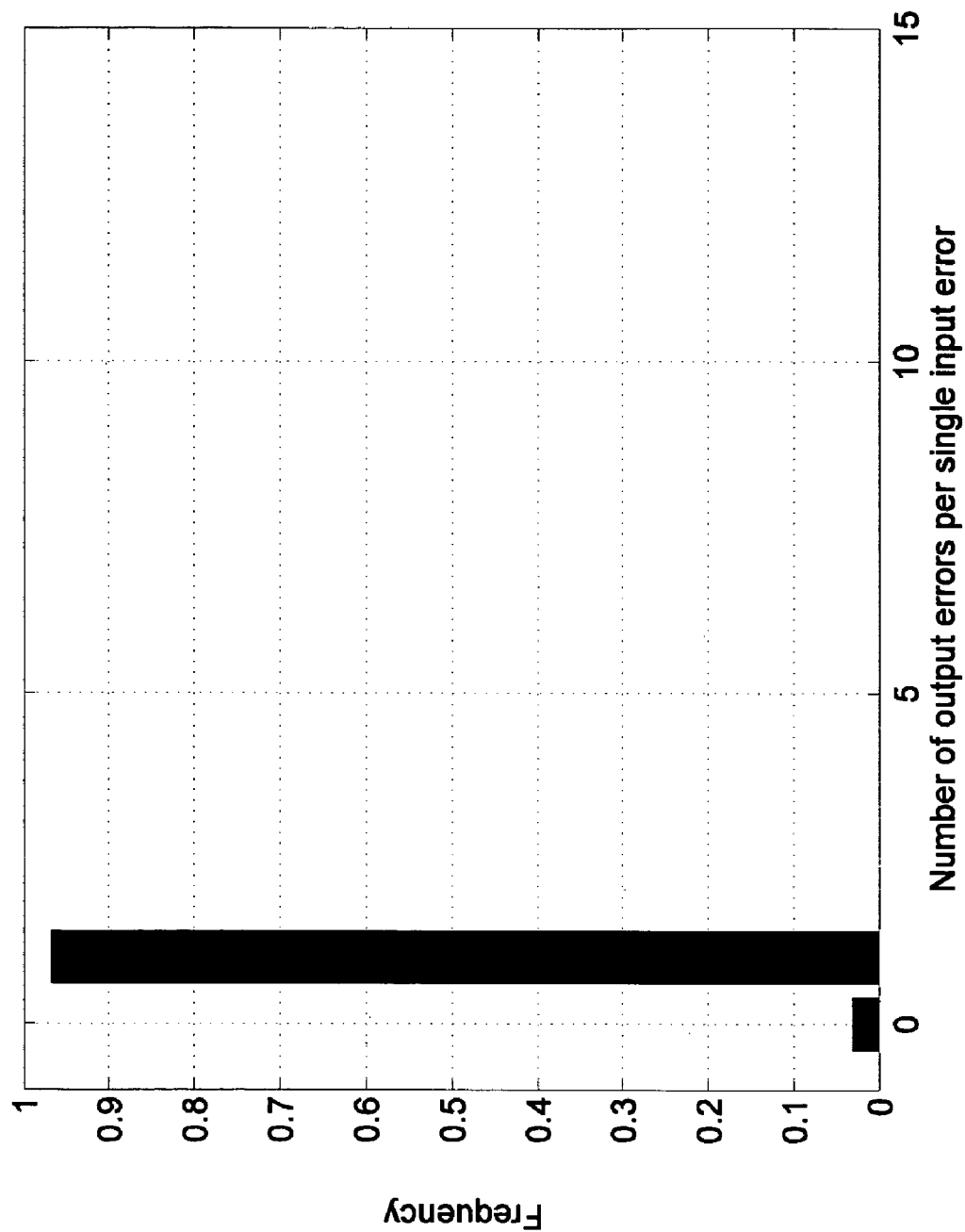
FIG. 10 is an illustrative example of results of the error propagation test using artificial insertion of single errors at the input of the proposed DCF decoder.
Figure 11:
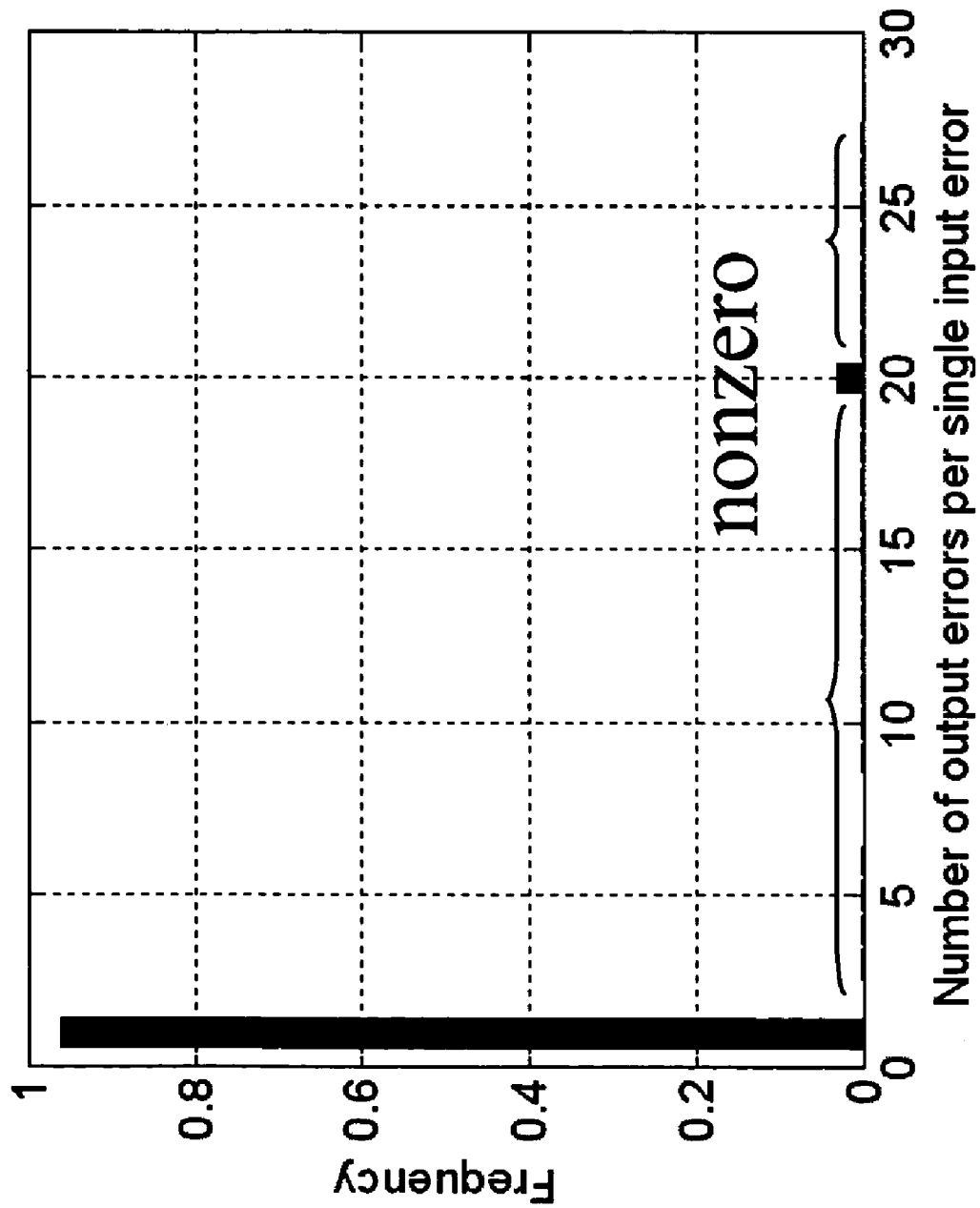
FIG. 11 is an illustrative example of results of the error propagation test using artificial insertion of single errors at the input of the existing DCF decoder.

Two types of tests were run to evaluate error propagation in the designed DCF decoder (modulation encoder 210) of the present invention. In the first test (designated test "A" for discussion purposes), single bit errors are artificially created at the input of the DCF decoder at different positions of the coded sector. Each single bit input error can create multiple output errors. The number of errors produced by the DCF decoder at its output is counted. The simple Hamming code was used in an implementation of the DCF encoder to protect flag bits in the data sector. This solution results in close to zero error propagation. As can be seen from FIG. 10, in test "A", almost all single input errors became single output errors, or were corrected by the Hamming decoder when they are inserted in flag positions. The results of the same test for prior art DCF codes are shown in FIG. 11. As we can see from this figure, in the existing DCF scheme, a single error at the input of the DCF decoder can produce up to 27 output errors.

Results of the Error Propagation Test B.

In the second test (designated test "B"), the BER was directly estimated at the input and output of the DCF decoder (modulation encoder 210) by simulation of a complete perpendicular magnetic recording system. In the simulations, the received signal was equalized using a generalized partial response target of length 4 (GPR4). An AC-coupled preamp was modeled by the high path filter with the cut-off frequency set to $\frac{1}{1000}$ of the baud rate. User normalized linear density (uND) is equal to 2.3, while the channel bit density (cbd) is adjusted according to the code rate R using the formula cbd=uND/R.

Figure 12:
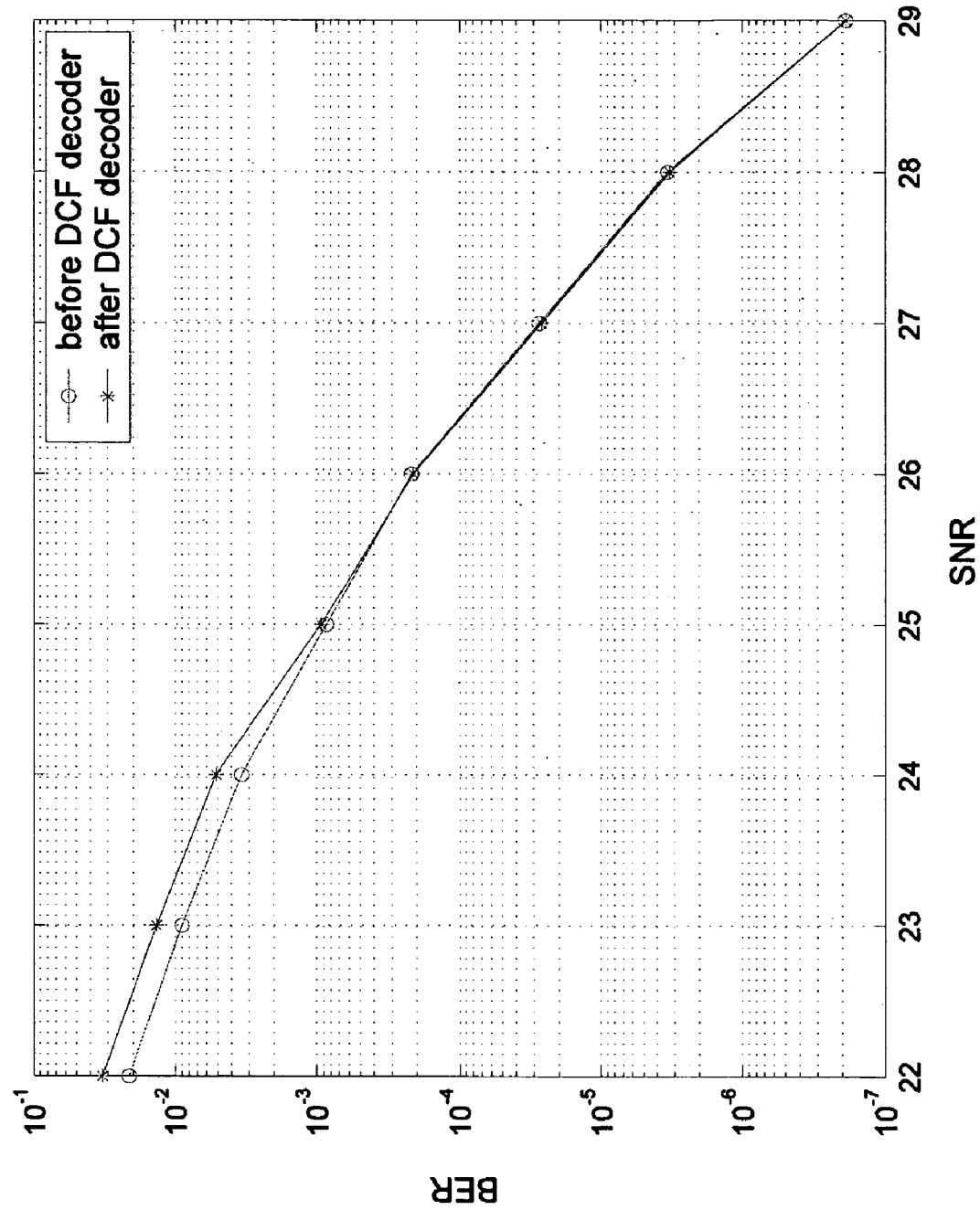
FIG. 12 is a graph of the BER, before and after the DCF decoder, versus signal to noise ratio (SNR) of the additive trellis code used in the perpendicular channel with electronic noise (no media noise), user normalized density ND=2.3, generalized partial response target of length 4 (GPR4) is used in simulations.
Figure 13:
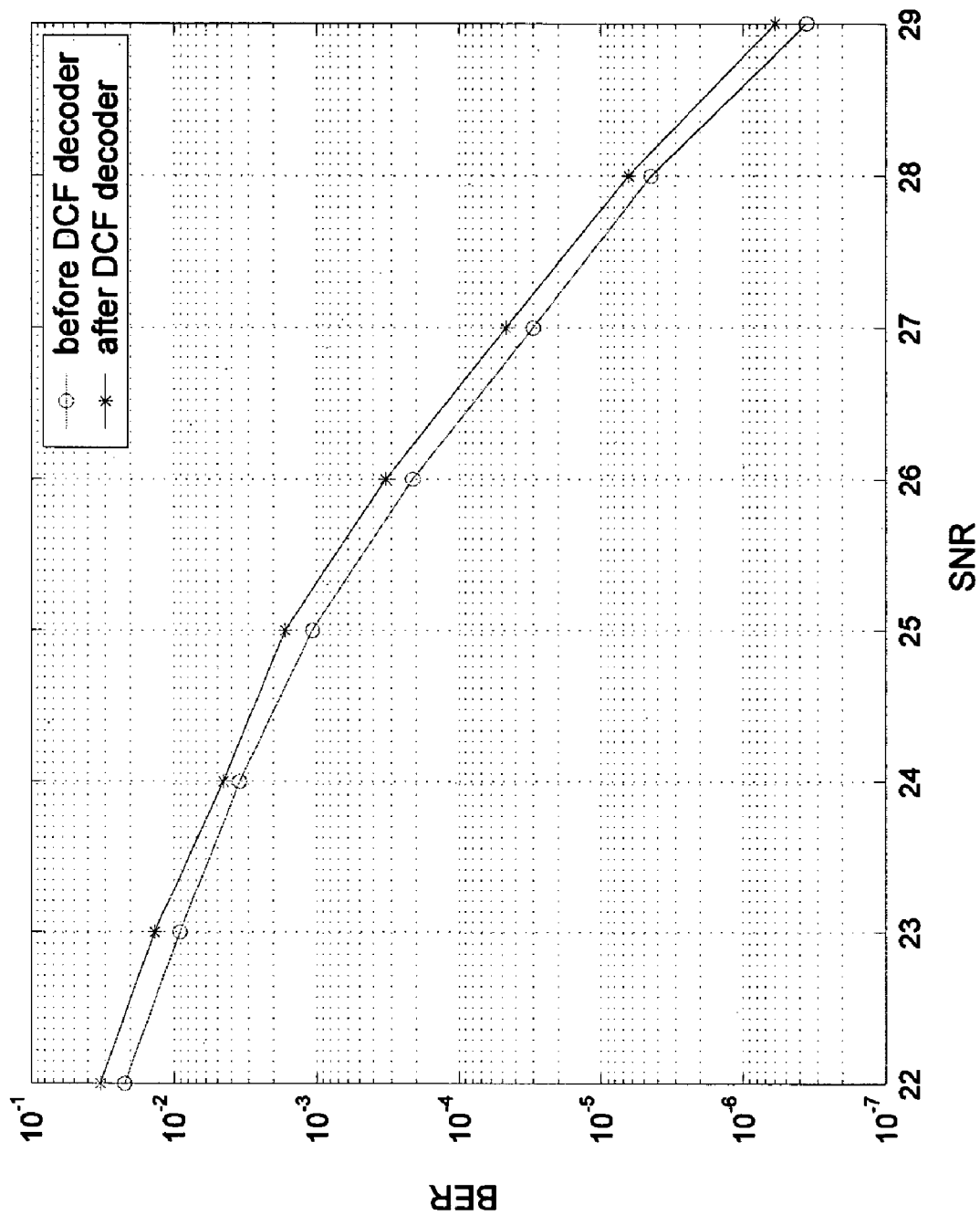
FIG. 13 is a graph of the BER, before and after the DCF decoder, versus SNR of a conventional DCF code used in the perpendicular channel with electronic noise (no media noise), user normalized density ND=2.3, GPR4 target is used in simulations.

FIG. 12 shows the bit error rates (BER), before and after the DCF decoder, versus signal to noise ratio (SNR) of the additive trellis code used in the perpendicular channel without media noise. As we can see from this figure, at the moderate and high values of SNR the encoding/decoding scheme of the present invention has close to zero error propagation in the DCF decoder. For comparison, shown in FIG. 13 is the BER, before and after the DCF decoder, versus signal to noise ratio (SNR) of a conventional DCF code used in the same perpendicular magnetic recording channel. In this figure the error propagation is visible at all values of SNR.

Figure 14:
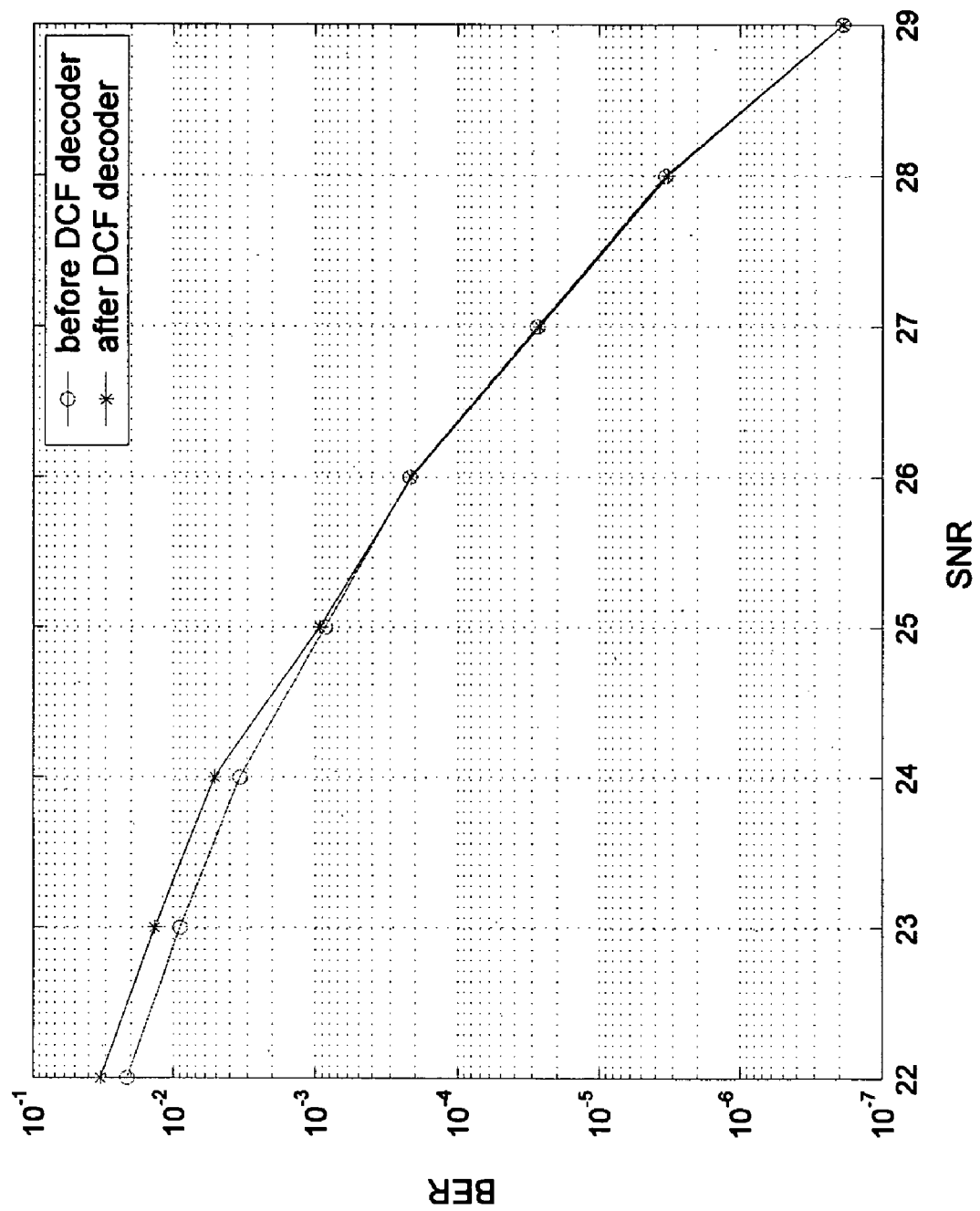
FIG. 14 is a graph of the BER, before and after the DCF decoder, versus SNR of the additive trellis code used in the perpendicular channel with 60% of media noise and 40% of electronic noise, user ND=2.3, GPR4 target is used in simulations.
Figure 15:
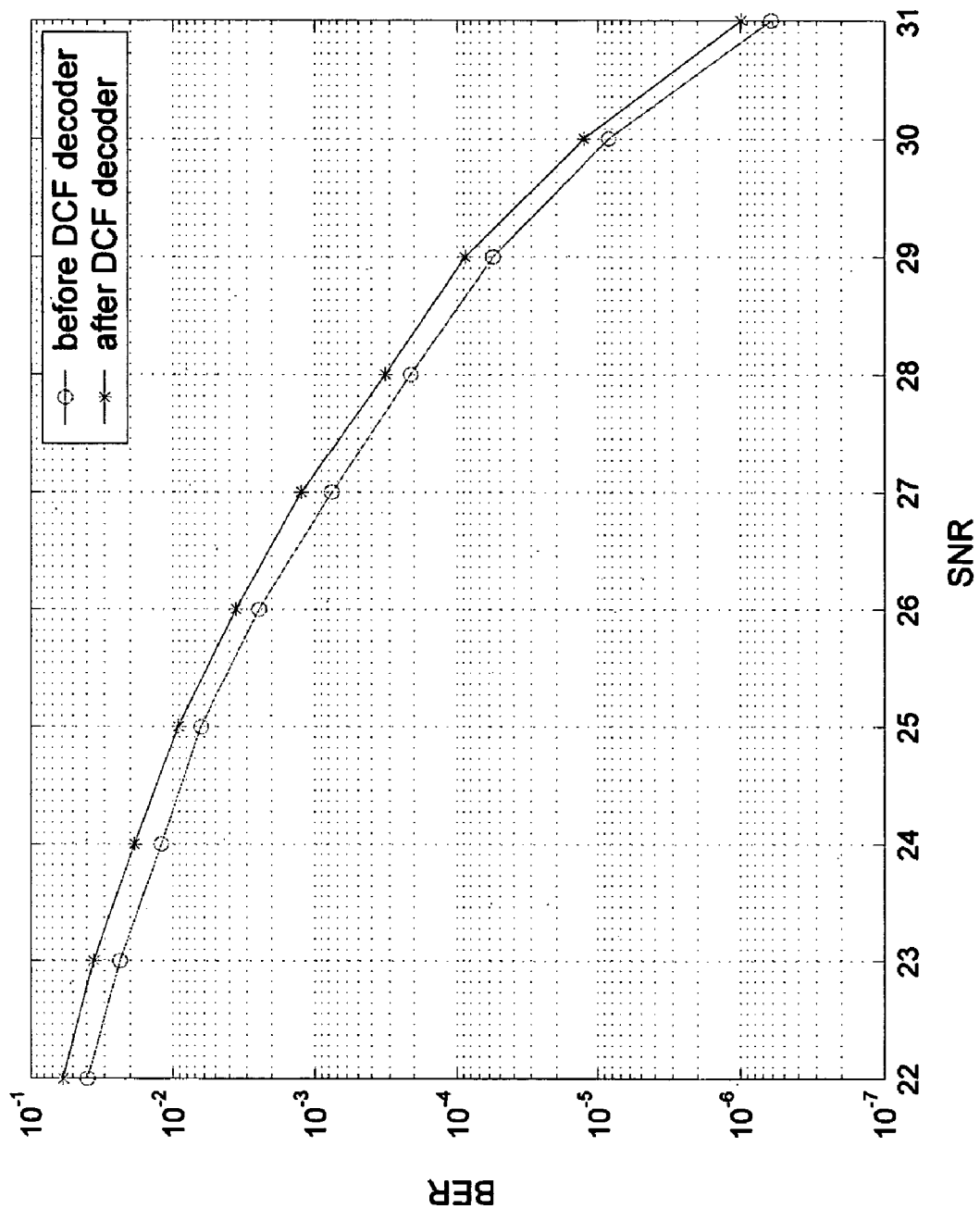
FIG. 15 is a graph of the BER, before and after the DCF decoder, versus SNR of a conventional DCF code used in the perpendicular channel with the 60% of media noise and 40% of electronic noise, user ND=2.3, GPR4 target is used in simulations.

FIG. 14 shows the bit error rates (BER), before and after the DCF decoder, versus signal to noise ratio (SNR) of the additive trellis code used in the perpendicular channel with 60% of media noise and 40% of electronic noise. Again, it can be seen from this figure that at the moderate and high values of SNR, the encoding/decoding scheme of the present invention has close to zero error propagation in the DCF decoder. For comparison, shown in FIG. 15 is the corresponding BER, before and after the DCF decoder, versus signal to noise ratio (SNR) of a conventional DCF code used in the same perpendicular magnetic recording channel. In this figure, the error propagation is again visible at all values of SNR.

Appendix A.

Let $Y_s$ be the number of different words that can be transmitted without a single error through the constraint deterministic channel set to the state $s \in S$.

Lemma. For an arbitrary constraint deterministic channel with an "informed" encoder, receiving the side information, and any integer m such that $$q^m \cdot \ln(q^m|S|) \leq N_0 = \min_{s \in S} |Y_s|,$$

there exists a set of matching patterns C with $L=q^{n-m}$ words, such that for any $u \in U$ and $s \in S$ $$B_u \cap Y_s \neq \emptyset.$$

It is to be understood that even though numerous characteristics and advantages of various embodiments of the invention have been set forth in the foregoing description, together with details of the structure and function of various embodiments of the invention, this disclosure is illustrative only, and changes may be made in detail, especially in matters of structure and arrangement of parts within the principles of the present invention to the full extent indicated by the broad general meaning of the terms in which the appended claims are expressed. For example, the particular elements may vary depending on the particular application for the encoding system while maintaining substantially the same functionality without departing from the scope and spirit of the present invention. In addition, although embodiments described herein are directed toward use in a data storage system, it will be appreciated by those skilled in the art that the teachings of the present invention can be applied to other data storages systems and communication systems, for example, without departing from the scope and spirit of the present invention.

Further, while in some embodiments the present invention is described with reference to a search of a "full trellis", it is not necessary that the trellis representation be a full trellis representation. The present invention can also be used in a "partial trellis" representation, for example one in which some edges are deleted from the full trellis. This deletion of edges (pruning of the trellis) can in some embodiments result in increased efficiency or other processing benefits.

What is claimed is:

1. A method of additive encoding of data words, the method comprising:
   receiving a plurality of data words; and
   searching a trellis representation of additive code words to identify a path in the trellis representing a sequence of patterns to be used to encode the data words.

2. The method of claim 1, wherein searching the trellis representation of additive code words to identify the path in the trellis further comprises searching the trellis representation to identify a sequence of flags representing the sequence of patterns to be used to encode the data words.

3. The method of claim 2, wherein searching the trellis representation of additive code words further comprises searching the trellis representation of all possible combinations of matching patterns in a sequence of additive code words to identify the sequence of flags representing the sequence of patterns to be used to encode the data words.

4. The method of claim 2, and further comprising modulation encoding the plurality of data words using the additive code words corresponding to the identified path in the trellis.

5. The method of claim 4, wherein modulation encoding the plurality of data words comprises additive coding the plurality of data words by adding patterns in the identified sequence of patterns to the plurality of data words.

6. The method of claim 5, wherein additive coding the plurality of code words further comprises beginning additive coding before terminating the step of searching the trellis representation of additive code words at a final state, wherein the flags already produced at the earlier stages of the trellis search are used to choose the matching patterns.

7. The method of claim 4, wherein receiving the plurality of data words further comprises receiving N data words to be encoded in a sector, and wherein searching the trellis representation of additive code words to identify the path in the trellis further comprises searching the trellis representation of additive code words to identify the path which optimizes a metric.

8. The method of claim 7, wherein the metric includes and accumulated variance, and wherein searching the trellis representation of additive code words to identify the path in the trellis further comprises searching the trellis representation of additive code words to identify the path which will minimize an absolute value of the accumulated variance.

9. The method of claim 8, and further comprising calculating the accumulated variance metric by distinguishing positive and negative values of running digital sum for a given sequence of N additive code words, calculating an accumulated variance of positive values of running digital sum for the given sequence of N additive code words, calculating an accumulated variance of negative values of running digital sum for the given sequence of N additive code words, and adding the calculated accumulated variance of positive values and the accumulated variance of negative values to obtain the accumulated variance metric.

10. The method of claim 7, wherein receiving the plurality of data words further comprises receiving the N data words to be encoded into N additive code words of a sector, wherein each flag comprises r bits, wherein a state of the trellis is a block of v flag bits, and wherein searching the trellis representation of additive code words further comprises searching $2^v$ states of the trellis corresponding to rN/v sections of the trellis to identify the path.

11. The method of claim 10, wherein searching the trellis representation of additive code words to identify the path which optimizes the metric further comprises:
at a first time t=1, for each state s∈S in the trellis, calculating and storing a running digital sum value RDS(1,s) of a first block of nv bits and a metric $\mu(1,s)$ of a code sequence;
at times t>1 after the first time, and for each section of the trellis, for each state s∈S in the corresponding section of the trellis, analyzing all preceding states s' to define and store a final value of the running digital sum value RDS(t,s) of a new code sequence comprising a survivor of the preceding states s' and an extension of a code word defined by the state s, and to define a new metric $\mu(t,s)$ of the new code sequence defined by the states s' and s;
after comparing all preceding states s', for each section of the trellis, discarding all preceding states s', except a survivor state, and saving a direction to the survivor state s';
after analyzing all states in all sections of the trellis, determining a best final state, wherein a best survived path is identified as the best final state and the surviving sequence of states; and
using a sequence of flags corresponding to the best survived path in the trellis to generate an output coded sector.

12. An apparatus for additively encoding data words, the apparatus comprising:
an input which receives a plurality of data words; and
modulation encoding circuitry configured to search a trellis representation of additive code words to identify a path in the trellis representing a sequence of patterns to be used to encode the received plurality of data words.

13. The apparatus of claim 12, wherein the modulation encoding circuitry comprises:
a trellis generator which receives the plurality of data words and the sequence of patterns as an input, and in response generates the trellis representation of the additive code words; and
a trellis search component coupled to the trellis generator which searches the trellis representation of additive code words to identify the path.

14. The apparatus of claim 13, and further comprising a trellis storage component, coupled to the trellis generator and to the trellis search component, which stores the generated trellis representation of the additive code words.

15. The apparatus of claim 13, wherein the trellis search component provides as an output flags representative of the identified path.

16. The apparatus of claim 15, and further comprising an encoder which receives the flags as an input and provides code words as an output.

17. The apparatus of claim 16, wherein the encoder provides as the output an encoded sector comprising the code words and the flags.

18. The apparatus of claim 12, wherein the modulation encoding circuitry is configured to search the trellis representation of additive code words to identify the path in the trellis by searching the trellis representation to identify a sequence of flags representing the sequence of patterns to be used to encode the data words.

19. The apparatus of claim 18, wherein the modulation encoding circuitry is configured to search the trellis representation of all possible combinations of matching patterns in a sequence of additive code words to identify the sequence of flags representing the sequence of patterns to be used to encode the data words.

20. The apparatus of claim 18, wherein the modulation encoding circuitry is further configured to modulation encode the plurality of data words using the additive code words corresponding to the identified path.

21. The apparatus of claim 20, wherein the plurality of data words received at the input comprises N data words to be encoded in a sector, and wherein the modulation encoding circuitry is configured to search the trellis representation of additive code words to identify the path which optimizes a metric.

22. The apparatus of claim 21, wherein the metric includes and accumulated variance, and wherein the modulation encoding circuitry is configured to search the trellis representation of additive code words to identify the path which will minimize an absolute value of the accumulated variance.

23. The apparatus of claim 22, and wherein the modulation encoding circuitry is further configured to calculate the accumulated variance metric by distinguishing positive and negative values of running digital sum for a given sequence of N additive code words, by calculating an accumulated variance of positive values of running digital sum for the given sequence of N additive code words, by calculating an accumulated variance of negative values of running digital sum for the given sequence of N additive code words, and by adding the calculated accumulated variance of positive values and the accumulated variance of negative values to obtain the accumulated variance metric.

24. The apparatus of claim 21, wherein the N data words received at the input are to be encoded into N additive code words of a sector, wherein each flag comprises r bits, wherein a state of the trellis is a block of v flag bits, and wherein the modulation encoding circuitry is configured to search the trellis representation of additive code words by searching $2^v$ states of the trellis corresponding to rN/v sections of the trellis to identify the path in the trellis.

25. The apparatus of claim 12, wherein the modulation encoding circuitry comprises a direct current free encoder.

* * * * *